United States Patent
Simpson et al.

(10) Patent No.: US 12,222,645 B2
(45) Date of Patent: **\*Feb. 11, 2025**

(54) LITHOGRAPHIC PRINTING PLATE PRECURSOR AND METHOD OF USE

(71) Applicant: Eastman Kodak Company, Rochester, NY (US)

(72) Inventors: Christopher D. Simpson, Osterode (DE); Stefanie Hansmann, Osterode (DE); Saija Werner, HattorF (DE); Jianbing Huang, Trumbull, CT (US)

(73) Assignee: EASTMAN KODAK COMPANY, Rochester, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 17/844,953

(22) Filed: Jun. 21, 2022

(65) Prior Publication Data
US 2023/0314935 A1    Oct. 5, 2023

Related U.S. Application Data

(63) Continuation-in-part of application No. 17/685,570, filed on Mar. 3, 2022, now abandoned.

(51) Int. Cl.
*G03F 7/004* (2006.01)
*B41C 1/10* (2006.01)
*G03F 7/029* (2006.01)

(52) U.S. Cl.
CPC .......... *G03F 7/0045* (2013.01); *B41C 1/1008* (2013.01); *G03F 7/0295* (2013.01)

(58) Field of Classification Search
CPC ....................................................... G03F 7/00
See application file for complete search history.

(56) References Cited

U.S. PATENT DOCUMENTS

| | | |
|---|---|---|
| 5,008,238 A | 4/1991 | Gotoh et al. |
| 7,524,614 B2 | 4/2009 | Tao et al. |
| 7,553,603 B2 | 6/2009 | Iftime et al. |
| 7,723,010 B2 | 5/2010 | Nguyen et al. |
| 7,770,534 B2 | 8/2010 | Cooperman |
| 7,910,768 B2 | 3/2011 | Nguyen et al. |
| 7,955,682 B2 | 6/2011 | Gore |
| 8,021,827 B2 | 9/2011 | Nguyen et al. |
| 8,084,182 B2 | 12/2011 | Munnelly et al. |
| 8,148,042 B2 | 4/2012 | Callant et al. |
| 8,178,282 B2 | 5/2012 | Callant et al. |
| 8,323,867 B2 | 12/2012 | Nguyen et al. |
| 8,632,941 B2 | 1/2014 | Balbinot et al. |
| 9,034,090 B2 | 5/2015 | Kozee et al. |
| 2005/0170282 A1 | 8/2005 | Inno et al. |
| 2006/0269874 A1 | 11/2006 | Huang et al. |
| 2009/0047599 A1 | 2/2009 | Horne et al. |
| 2010/0040976 A1 | 2/2010 | Callant et al. |
| 2010/0221662 A1 | 9/2010 | Callant et al. |
| 2010/0274023 A1 | 10/2010 | Callant et al. |
| 2016/0259243 A1 | 9/2016 | Hayakawa et al. |
| 2016/0263930 A1 | 9/2016 | Lenaerts et al. |
| 2017/0217149 A1 | 8/2017 | Hayashi et al. |
| 2018/0155483 A1 | 6/2018 | Kohl et al. |
| 2018/0356730 A1 | 12/2018 | Inasaki et al. |
| 2019/0329545 A1 | 10/2019 | Shibamoto et al. |
| 2020/0096865 A1 | 3/2020 | Igarashi et al. |
| 2020/0117086 A1 | 4/2020 | Nogoshi et al. |
| 2020/0147950 A1 | 5/2020 | Billiet |
| 2021/0078350 A1 | 3/2021 | Viehmann et al. |
| 2022/0118787 A1* | 4/2022 | Koyama ................... B41N 1/14 |

FOREIGN PATENT DOCUMENTS

| | | | |
|---|---|---|---|
| EP | 1 637 324 A2 | 3/2006 | |
| EP | 2 018 365 B1 | 11/2014 | |
| EP | 3 101 475 A1 | 12/2016 | |
| EP | 3 793 829 A1 | 11/2019 | |
| EP | 3 587 112 A1 | 1/2020 | |
| EP | 3 587 113 A1 | 1/2020 | |
| EP | 3 674 796 A1 | 7/2020 | |
| JP | 2005062482 A | 3/2005 | |
| JP | 5704720 B2 | 4/2015 | |
| JP | 2018100340 A | 6/2018 | |
| WO | WO-2010033182 A1 * | 3/2010 | ........... B41C 1/1008 |
| WO | WO2012/115124 A1 | 8/2012 | |
| WO | WO2012/133382 | 10/2012 | |
| WO | WO2013/047228 A1 | 4/2013 | |
| WO | WO2013/047229 A1 | 4/2013 | |
| WO | WO2015/046298 A1 | 4/2015 | |
| WO | WO2019219560 A1 | 11/2019 | |
| WO | WO2019219565 A1 | 11/2019 | |
| WO | WO2019219570 A1 | 11/2019 | |
| WO | WO2019219574 A1 | 11/2019 | |
| WO | WO2019219577 A1 | 11/2019 | |
| WO | WO2020090995 A1 | 5/2020 | |
| WO | WO2020/262689 | 12/2020 | |
| WO | WO-2020262689 A1 * | 12/2020 | ........... B41C 1/1016 |
| WO | WO2021/171862 A1 | 9/2021 | |
| WO | WO2021241457 | 12/2021 | |
| WO | WO-2021241457 A1 * | 12/2021 | ........... B41C 1/1016 |
| WO | WO2021241458 | 12/2021 | |
| WO | WO-2021241458 A1 * | 12/2021 | ........... B41C 1/1016 |

* cited by examiner

*Primary Examiner* — Chanceity N Robinson
(74) *Attorney, Agent, or Firm* — J. Lanny Tucker

(57) ABSTRACT

IR-sensitive lithographic printing plate precursors provide a stable print-out image using a unique IR-sensitive image-recording layer. The IR radiation-sensitive layer includes: (1) a free radical initiator composition with an electron-donating agent and one or more iodonium cations; (2) a free radically polymerizable composition; and (3) a color-changing compound of Structure (I) having an indene ring in the conjugated chain between the aromatic terminal groups. The IR radiation-sensitive composition and layer also contains one or more borate ions such that the molar ratio of one or more borate ions to the one or more iodonium ions is at least 0.5:1. After IR imaging, these precursors exhibit desirable printout images both fresh and after dark storage. The precursors can be developed on-press.

22 Claims, No Drawings

LITHOGRAPHIC PRINTING PLATE PRECURSOR AND METHOD OF USE

CROSS-REFERENCE TO RELATED APPLICATIONS

This application is a Continuation-in-part of Publication No. 2022/0324220, filed Mar. 3, 2022, which also has a priority date of Apr. 1, 2021 from U.S. Ser. No. 63/169,278.

Also referenced is U.S. Publication No. 2022/0317569, filed Mar. 3, 2022, which also has a priority date of Apr. 1, 2021 from U.S. Ser. No. 63/169,279.

FIELD OF THE INVENTION

This invention relates to infrared radiation-sensitive lithographic printing plate precursors that can be imaged using infrared radiation to provide imaged lithographic printing plates. Such precursors include unique infrared radiation-sensitive compositions that provide a stable printout image between exposed and non-exposed regions in the imagewise exposed infrared radiation-sensitive image-recording layer. This invention also relates to methods of using these precursors to provide lithographic printing plates having excellent printout images.

BACKGROUND OF THE INVENTION

In lithographic printing, lithographic ink receptive regions, known as image areas, are generated on a hydrophilic surface of a planar substrate such as an aluminum-containing substrate. When the printing plate surface is moistened with water and a lithographic printing ink is applied, hydrophilic regions retain the water and repel the lithographic printing ink, and the lithographic ink receptive image regions accept the lithographic printing ink and repel the water. The lithographic printing ink is transferred to the surface of a material upon which the image is to be reproduced, perhaps with the use of a blanket roller in a printing press.

Negative-working lithographic printing plate precursors useful to prepare lithographic printing plates typically comprise a negative-working radiation-sensitive image-recording layer disposed over the hydrophilic surface of the substrate. Such an image-recording layer includes radiation-sensitive components that can be dispersed in a suitable polymeric binder material. After the precursor is imagewise exposed to suitable radiation to form exposed regions and non-exposed regions in the image-recording layer, the non-exposed regions are removed by suitable means, revealing the underlying hydrophilic surface of the substrate. The exposed regions of the image-recording layer that are not removed are lithographic ink-receptive, and the hydrophilic substrate surface revealed by the developing process accepts water and aqueous solutions such as a fountain solution and repels lithographic printing ink.

In recent years, there has been an increased desire in the lithographic printing industry for simplification in making lithographic printing plates by carrying out development on-press ("DOP") using a lithographic printing ink or fountain solution, or both, to remove non-exposed regions of the image-recording layer.

Thus, on-press developable lithographic printing plate precursors have gained increasing attention in the printing industry in recent decades due to their many benefits over conventionally processed ("off-press" processed or developed) lithographic printing plate precursors, including less environmental impact and savings on processing chemicals, processor floor space, operation and maintenance costs. After laser imaging, on-press developable precursors can be taken directly to the printing press without any prior wet chemical step of removing the imageable coating on the precursors in the non-printing regions.

Therefore, it is highly desirable that such imaged lithographic printing plate precursors have different colors in the exposed regions and the unexposed regions. The color difference or "contrast" between the exposed and unexposed regions is typically called "printout" or a "printout image." A strong printout will facilitate the operator's visual assessment and identification of the imaged printing plate precursors so that the printing plate precursors can be properly attached to printing press units.

Many approaches have been taken to strengthen the printout of on-press developable printing plate precursors. It has been observed that they all have weaknesses of some kind.

For example, the printout on printing plate precursors having imaging compositions that comprise an acid generator and an acid-sensitive color precursor such as lactone based leuco dyes, is often not strong enough due to the limited efficiency of acid generation in imaging compositions designed for infrared radiation imaging and on-press development. Furthermore, the concentration of protons generated during infrared radiation imaging often decreases after imaging through chemical equilibration or other post-imaging chemical reactions. As a result, the printout based on proton-induced color change often fades after imaging.

Co-pending and commonly assigned U.S. Patent Application Publication 2021/0078350 (Viehmann et al.) describes efforts to increase printout by incorporating more sensitive color-forming compounds that switch from colorless forms to colored forms at lower acid concentrations into the infrared radiation-sensitive imaging compositions. Background color formation is suppressed by a special additive to stabilize the good contrast. The initial printout achieved is quite high but there remains a need to improve the printout and the printout stability obtained using the described chemistry.

A different approach to generating printout is based on the use of infrared (IR) decomposable dyes that comprise a thermal labile group and are capable of losing the thermal labile group upon exposure to infrared radiation or heat to form compounds of different colors having absorption spectra in the visible spectral region. Examples based on this approach are described in U.S. Pat. No. 8,148,042 (Callant et al.) and U.S. Pat. No. 8,178,282 (Callant et al.) and U.S. Patent Application Publication 2010/0274023 (Callant et al.). Such IR decomposable dyes typically must be present in relatively large amounts in the imaging composition, or at lower amounts and high exposure infrared radiation energy is needed in order to generate sufficient printout.

Furthermore, some IR decomposable dyes used in such chemistries produce gaseous materials upon decomposition, which gaseous materials are often harmful for negative working compositions based on crosslinking of free radical polymerizable compounds in the presence of a suitable free radical initiator, resulting in poor image durability during printing operations. Moreover, the heat pulse generated from high energy levels of exposing infrared radiation can often damage the physical integrity of the imaging compositions according to a process commonly referred to as ablation or partial ablation. Ablation or partial ablation typically results in poor image durability. For example, in U.S. Pat. No. 8,148,042 (noted above), described printing plate precursors PPP34 and PPP35 comprising IR decomposable dyes within imaging compositions required 275 mJ/cm² imaging energy in order to generate a cyan printout (AOD) of 0.43 and 0.60. There is no teaching that such imaging compositions are useful to form a printing plate having adequate durability of the infrared radiation exposed regions after development of any kind.

The inability for the IR decomposable dyes taught in U.S. Pat. No. 8,148,042 (noted above) to form strong printout under more practical exposure energy such as 120 mJ/cm² or less when incorporated directly within the polymerizable composition was demonstrated in U.S. Patent Application Publication 2020/0147950 (Billiet), where PPP04 using IR decomposable dye IR02 combined with the IR01 as used in PPP03 produced a very small printout benefit over PPP03 (for example, a ΔE at 120 mJ/cm² of 2.99 vs 2.12). The ΔE parameter of Billiet is similar to the ΔE parameter defined below.

In order to avoid ineffectiveness as well as the undesirable effects of the IR decomposable dyes on negative-working printing plate precursors having polymerizable imaging compositions, WO 2019/219560 (Billiet et al.) teaches placing IR decomposable dyes into the protective overcoat applied on top of an imageable layer comprising an IR imageable composition. However, the presence of a protective layer in a lithographic printing plate precursor requires an extra step during manufacturing and when present, its removal reduces the speed of development. Additionally, it can release polymeric or other materials into the fountain solution and cause malfunction of the lithographic printing operation when the printing plate precursors are developed on press. Furthermore, the printout generated with typical exposure dose of infrared radiation suitable for such IR-sensitive imageable compositions is still far less than desired.

U.S. Patent Application Publication 2019/0329545 (Shibamoto et. al.) teaches the use of certain IR decomposable dyes that, in their excited state, are capable of accepting an electron from an electron-donating type initiator upon exposure to infrared radiation to form a first wave of free radicals from the electron-donating initiators and further capable of forming a second wave of free radicals from the IR decomposable dyes through further decomposition on their own or through further reaction with electron-accepting type initiators. The reference suggests color formation capabilities of such imaging compositions containing IR decomposable dyes under the demonstrated exposure conditions. While this publication describes certain infrared dyes that are considered IR decomposable therein, none of the working examples used any IR decomposable dyes as taught in either of U.S. Pat. No. 8,148,042 (noted above) and U.S. Patent Application Publication 2010/0274023 (noted above). On the other hand, the teaching in U.S. Patent Application Publication 2019/0329545 (noted above) considers, as IR decomposable infrared dyes, those taught in U.S. Pat. No. 8,632,941 (Balbinot et al.).

U.S. Patent Application Publication 2020/0117086 (Nogoshi et al.) describes a combination of certain IR decomposable dyes with certain color developers. In the absence of the specified color developer, the specified IR decomposable dyes of this teaching do not have adequate printout as illustrated by its Comparative Examples 1 and 2.

U.S. Pat. No. 8,084,182 (Munnelly et al.) teaches the use of certain IR decomposable dyes within IR-sensitive polymerizable compositions. In its Examples 1-3, Munnelly et al. demonstrated good printout (ΔE values of 13.8 to 17.4) at high exposure dose of 300 mJ/cm² in imageable compositions containing IR decomposable dyes that contain an alkoxy carbonylamino group combined, used in combination with a traditional acid-sensitive dye precursor. Without that acid-sensitive dye precursor present, however, Example 4 of Munnelly et al. showed much lower printout (a ΔE of 6.6). The use of a comparative IR decomposable dye from the teaching of U.S. Pat. No. 8,148,042 (noted above), not containing an alkoxycarbonylamino group, also provided a low printout at 300 mJ/cm² imaging energy even in the presence of an acid-sensitive dye precursor (a ΔE of 4.6). Moreover, Munnelly et al. only demonstrated a short press run for 200 copies, and it is not apparent whether the printing plates derived from the precursors of Munnelly et al would have sufficient image durability during printing to satisfy customers in the industry who typically need to print many more than 200 copies in a typical press run.

Despite all of the efforts described in the known literature about providing adequate printout for on-press developable lithographic printing plates with exceptional press run durability, there is an ongoing need to provide on-press developable lithographic printing plate precursors that not only have essential properties required such as fast imaging speed, good on-press developability, good lithographic printing durability, and good shelf life, but that also exhibit strong and stable printout using lower exposure energy as required for high productivity.

SUMMARY OF THE INVENTION

The present invention provides a lithographic printing plate precursor comprising: a substrate, and an infrared radiation-sensitive image-recording layer disposed on the substrate, the infrared radiation-sensitive image-recording layer comprising the following components (1), (2), and (3):

(1) a free radical initiator composition that is capable of generating free radicals upon exposure to infrared radiation, and which comprises an electron-donating agent and one or more iodonium cations;
(2) a free radically polymerizable composition; and
(3) a color-changing compound that is represented by the following Structure (I)

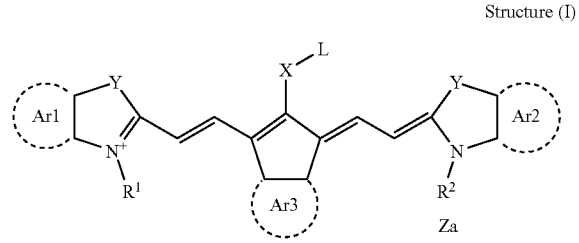

Structure (I)

wherein:
Ar1, Ar2, and Ar3 independently represent the atoms necessary to complete substituted or unsubstituted aromatic rings or to complete substituted or unsubstituted heteroaromatic rings;
Y represents an oxygen atom, a sulfur atom, or a dialkylmethylene group represented by >C(R⁴R⁵) wherein R⁴ and R⁵ are independently substituted or unsubstituted alkyl groups having 1 to 4 carbons;
R¹ and R² are independently substituted or unsubstituted alkyl groups;
X represents a single bond or a divalent linking group selected from —S—, —O—, and >N(R⁶) wherein R⁶ is hydrogen, a substituted or unsubstituted alkyl group, a substituted or unsubstituted aryl group, a substituted or unsubstituted heteroaryl group, or L;

L represents a —C(=O)—OR$^7$ group, —SO$_2$—R$^3$ group, or —SO$_2$NR$^8$R$^9$ group, wherein R$^7$ represents a substituted or unsubstituted alkyl group that has a secondary or tertiary connecting carbon that connects to the remainder of the —C(=O)OR$^7$ group; and R$^3$, R$^8$, and R$^9$ independently represent substituted or unsubstituted alkyl groups, substituted or unsubstituted aryl groups, or substituted or unsubstituted heteroaryl groups; and Za represents one or more counter ions to balance the electric charge in the rest of the color-changing compound according to Structure (I), wherein the infrared radiation-sensitive image-recording layer comprises one or more borate anions in an amount such that the molar ratio of the one or more borate anions to the one or more iodonium cations is at least 0.5:1 and, the borate anions are represented by following Structure (IIIa):

B(R$^{10}$R$^{11}$R$^{12}$R$^{13}$)$^-$      Structure (IIIa)

wherein R$^{10}$, R$^{11}$, R$^{12}$, and R$^{13}$ are independently substituted or unsubstituted alkyl groups or substituted or unsubstituted aryl groups, provided that at least three of R$^{10}$, R$^{11}$, R$^{12}$, and R$^{13}$ are the same or different substituted or unsubstituted aryl groups, and the substituted aryl groups each have no more than two halo substituents.

This invention also provides a method for providing a lithographic printing plate, comprising:

A) imagewise exposing the lithographic printing plate precursor according to any embodiment of the present invention described herein to infrared radiation, to provide exposed regions and non-exposed regions in the infrared radiation-sensitive image-recording layer, and B) removing the non-exposed regions in the infrared radiation-sensitive image-recording layer from the substrate on-press using a lithographic printing ink, a fountain solution, or a combination of a lithographic printing ink and a fountain solution.

The present invention provides a printout image generated in the infrared radiation-sensitive image-recording layer in the regions exposed to relatively low energy imaging infrared radiation. Such a printout image is strong and does not fade significantly during dark storage. Moreover, in many embodiments, the imaging chemistry used to provide the excellent printout image does not adversely affect imaging speed, on-press developability, or lithographic printing image durability. Further details of the present invention and the results obtained thereby are provided as follows.

DETAILED DESCRIPTION OF THE INVENTION

The following discussion is directed to various embodiments of the present invention and while some embodiments can be desirable for specific uses, the disclosed embodiments should not be interpreted or otherwise considered to limit the scope of the present invention, as claimed below. In addition, one skilled in the art will understand that the following disclosure has broader application than is explicitly described in the discussion of any specific embodiment.

Definitions

As used herein to define various components of the infrared radiation-sensitive image-recording layer, and other materials used in the practice of this invention, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term should be interpreted to have a standard dictionary meaning.

The use of numerical values in the various ranges specified herein, unless otherwise expressly indicated, are to be considered as approximations as though the minimum and maximum values within the stated ranges were both preceded by the word "about." In this manner, slight variations above and below the stated ranges may be useful to achieve substantially the same results as the values within the ranges. In addition, the disclosure of these ranges is intended as a continuous range including every value between the minimum and maximum values as well as the end points of the ranges.

Unless the context indicates otherwise, when used herein, the terms "lithographic printing plate precursor," "precursor," and "IR-sensitive lithographic printing plate precursor" are meant to be equivalent references to embodiments of the present invention.

As used herein, the term "infrared radiation absorber" refers to a compound or material that absorbs electromagnetic radiation in the near-infrared (near-IR) and infrared (IR) regions of the electromagnetic spectrum, and it typically refers to compounds or materials that have an absorption maximum in the near-IR and IR regions.

As used herein, the terms "near-infrared region" and "infrared region" refer to radiation having a wavelength of at least 750 nm and higher. In most instances, the terms are used to refer to the region of the electromagnetic spectrum of at least 800 nm and up to and including 1400 nm.

For the purposes of this invention, the strength of printout images is generally indicated by the parameter ΔE, which is the Euclidean distance in CIE 1976 L*a*b* color space between the colors of radiation-exposed region and radiation non-exposed region measured from reflection measurement in 45/0 geometry (non-polarized), using CIE 2° observer and D50 as illuminant according to EN ISO 11664-4 "Colorimetry—Part 4: CIE 1976 L*a*b* Colour space." and other known references. Color measurements can be done using commercial instruments such as Techkon SpectroDens. In CIE 1976 L*a*b color space, a color is expressed as three numerical color values: L* for the lightness (or brightness) of the color, a* for the green-red component of the color, and b* for the blue-yellow component of the color values.

For the purpose of this invention, visible spectral region refers to a spectral region for electromagnetic radiation having a wavelength from 400 nm to 700 nm.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

As used herein, the term "polymer" is used to describe a compound with relatively large molecular weight formed by linking together many small reactive monomers to form recurring units of the same chemical composition. These polymer chains usually form coiled structures in a random fashion. With the choice of solvents, a polymer can become insoluble as the chain length grows and become polymeric particles dispersed in the solvent medium. These particle dispersions can be very stable and useful in infrared radiation-sensitive image-recording layers described for use in the present invention. In this invention, unless indicated otherwise, the term "polymer" refers to a non-crosslinked material. Thus, crosslinked polymeric particles differ from the non-crosslinked polymeric particles in that the latter can be dissolved in certain organic solvents of good solvating property whereas the crosslinked polymeric particles may swell but do not dissolve in the organic solvent because the polymer chains are connected by strong covalent bonds.

The term "copolymer" refers to polymers composed of two or more different repeating or recurring units that are arranged along the polymer chain.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers.

As used herein, the term "ethylenically unsaturated polymerizable monomer" refers to a compound comprising one or more ethylenically unsaturated (—C═C—) bonds that are polymerizable using free radical or acid-catalyzed polymerization reactions and conditions. It is not meant to refer to chemical compounds that have only unsaturated —C═C— bonds that are not polymerizable under these conditions.

Unless otherwise indicated, the term "weight %" refers to the amount of a component or material based on the total solids of a composition, formulation, or layer. Unless otherwise indicated, the percentages can be the same for either a dry layer or the total solids of the formulation or composition.

As used herein, the term "layer" or "coating" can consist of one disposed or applied layer or a combination of several sequentially disposed or applied layers. If a layer is considered infrared radiation-sensitive and negative-working, it is both sensitive to infrared radiation (as described above for "infrared radiation-absorber") and negative-working in the formation of lithographic printing plates.

As used herein, the terms "on-press developable" and "on-press developability" refer to the capability of developing a precursor according to the present invention after infrared radiation exposing (imaging), by mounting the imaged precursor on a suitable printing press and carrying out development during the first few printed impressions using a fountain solution, a lithographic printing ink, or a combination of a fountain solution and a lithographic printing ink.

Uses

The lithographic printing plate precursors according to the present invention are useful for providing lithographic printing plates that exhibit desirable printout images after imagewise exposure. These lithographic printing plates are useful for lithographic printing during press operations. Lithographic printing plates can be prepared using on-press or off-press processing according to this invention. The lithographic printing plate precursors are prepared with the structure and components described as follows.

Lithographic Printing Plate Precursors

The precursors according to the present invention can be formed by suitable application of an infrared radiation-sensitive image-recording composition (as described below) to a suitable substrate (as described below) to form an infrared radiation-sensitive image recording layer that is negative-working. In general, the infrared radiation-sensitive image-recording composition (and resulting infrared radiation-sensitive image-recording layer) comprises: component (1) a free radical initiator composition that is capable of generating free radicals upon exposure to infrared radiation, and which also comprises an electron-donating agent and one or more iodonium cations; component (2) a free radically polymerizable composition; and component (3) a color-changing compound that is represented by the Structure (I) described below. All of these components (1), (2), and (3) are defined in detail below, and these components are the only essential components necessary to achieve the advantages of the present invention. In addition, it is essential that the infrared radiation-sensitive image-recording layer contains one or more borate anions in a specific molar ratio to the one or more iodonium cations, as described in detail below.

In some embodiments, the infrared radiation-sensitive image-recording composition (and resulting infrared radiation-sensitive image-recording layer) can further comprise a component (4) infrared absorbing material (or a mixture of two or more thereof) that is different from the (3) color-changing compound; and component (5) acid-sensitive dye precursor (or mixture of two or more thereof) that is different from all of the components (1), (2), (3), and (4); and a component (6) non-free radically polymerizable polymeric material (or mixture of two or more thereof) that is different from all of the components (1), (2), (3), and (4); or all of these components (4) through (6), all of which are described below. In some highly useful embodiments, the infrared radiation-sensitive image recording layer consists essentially of all of the noted components (1) through (6) to provide a desired lithographic printing plate precursor with desirable printout image and the best overall imaging and printing properties.

There is generally only one infrared radiation-sensitive image-recording layer in each precursor. This layer is generally the outermost layer in the precursor, but in some embodiments, there can be an outermost water-soluble hydrophilic protective layer (also known as a topcoat or oxygen barrier layer), as described below, disposed over (or directly on and in contact with) the infrared radiation-sensitive image-recording layer.

Substrate:

The substrate that is used to prepare the precursors according to this invention generally has a hydrophilic imaging-side surface, or at least a surface that is more hydrophilic than the applied infrared radiation-sensitive image-recoding layer. The substrate generally comprises an aluminum-containing support that can be composed of raw aluminum or a suitable aluminum alloy that is conventionally used to prepare lithographic printing plate precursors.

The aluminum-containing substrate can be treated using techniques known in the art, including roughening of some type by physical (mechanical) graining, electrochemical graining, or chemical graining, which is followed by one or more anodizing treatments. Each anodizing treatment is typically carried out using either phosphoric or sulfuric acid and conventional conditions to form a desired hydrophilic aluminum oxide (or anodic oxide) layer on the aluminum-containing support. A single aluminum oxide (anodic oxide) layer can be present or multiple aluminum oxide layers (for example an inner aluminum oxide layer and an outer aluminum oxide layer disposed on the inner aluminum oxide layer), each having multiple pores with varying depths and shapes of pore openings can be present. Such processes thus provide an anodic oxide layer(s) or aluminum oxide layer(s) underneath an infrared radiation-sensitive image-recording layer that can be provided as described below. A discussion of such pores and a process for controlling their width is described for example, in U.S. Patent Publications 2013/0052582 (Hayashi), 2014/0326151 (Namba et al.), and 2018/0250925 (Merka et al.), and U.S. Pat. No. 4,566,952 (Sprintschnik et al.), U.S. Pat. No. 8,789,464 (Tagawa et al.), U.S. Pat. No. 8,783,179 (Kurokawa et al.), and U.S. Pat. No. 8,978,555 (Kurokawa et al.), the disclosures of all of which are incorporated herein by reference, as well as in EP 2,353,882 (Tagawa et al.). Teaching about providing two sequential anodizing treatments to provide different aluminum oxide layers (for example, an outer aluminum oxide layer disposed over an inner aluminum oxide layer) in an improved substrate are described for example, in U.S. Patent Application Publication 2018/0250925 (noted above).

Sulfuric acid anodization of the aluminum support generally provides an aluminum (anodic) oxide weight (coverage) on the surface of at least 1 $g/m^2$ and up to and including 5 $g/m^2$ and more typically of at least 1.5 $g/m^2$ and up to and including 4 $g/m^2$. Phosphoric acid anodization generally provides an aluminum (anodic) oxide weight on the surface of from at least 0.5 $g/m^2$ and up to and including 5 $g/m^2$ and more typically of at least 1 $g/m^2$ and up to and including 3 $g/m^2$.

An anodized aluminum-containing substrate can be treated with an alkaline or acidic pore-widening solution to provide an anodic oxide layer containing columnar pores. In some embodiments, the treated aluminum-containing substrate can comprise a hydrophilic layer disposed directly on a grained, anodized, and post-treated aluminum-containing support, and such hydrophilic layer can comprise a non-crosslinked hydrophilic polymer having carboxylic acid side chains.

Alternatively, an anodized aluminum-containing support can be further treated to seal the anodic oxide pores or to hydrophilize its surface, or both, using known post-anodic treatment processes, such as post-treatments using aqueous solutions of hydrophilic materials. Representative hydrophilic materials of this type to provide a hydrophilic layer (such as a hydrophilic polymer coating) include but are not limited to poly(vinyl phosphonic acid) (PVPA), vinyl phosphonic acid copolymers, poly [(meth)acrylic acid] or its alkali metal salts, or (meth)acrylic acid copolymers or their alkali metal salts, mixtures of phosphate and fluoride salts, or sodium silicate. Such hydrophilic coating can be disposed on the outermost aluminum oxide layer (such as an outer aluminum oxide layer if multiple aluminum oxide layers are present). The post-treatment process materials can also comprise unsaturated double bonds to enhance adhesion between the treated surface and the overlying infrared radiation exposed regions. Such unsaturated double bonds can be provided in low molecular weight materials or they can be present within side chains of polymers. Useful post-treatment processes include dipping the substrate with rinsing, dipping the substrate without rinsing, and various coating techniques such as extrusion coating.

Particularly useful hydrophilic layer or coating materials for this purpose comprise: a compound having one or more ethylenically unsaturated polymerizable groups, one or more —OM groups at least one of which is connected directly to a phosphorus atom, and a molecular weight of less than 2000 g/mol, wherein M represents a hydrogen, sodium, potassium, or aluminum atom; and one or more hydrophilic polymers at least one of which hydrophilic polymers is a hydrophilic copolymer that comprises at least (a) recurring units comprising an amide unit, and (b) recurring units comprising an —OM' group that is directly connected to a phosphorus atom, wherein M' represents a hydrogen, sodium, potassium, or aluminum atom. This hydrophilic layer can be disposed over the outermost aluminum oxide layer at a dry coverage of at least 0.0002 $g/m^2$ and up to and including 0.1 $g/m^2$.

The thickness of a substrate can be varied but should be sufficient to sustain the wear from printing and thin enough to be wrapped around a printing form. Useful embodiments include a treated aluminum foil having a thickness of at least 100 μm and up to and including 700 μm. The backside (non-imaging side) of the substrate can be coated with antistatic agents, a slipping layer, or a matte layer to improve handling and "feel" of the precursor.

The substrate can be formed as a continuous roll (or continuous web) of sheet material that is suitably coated with an infrared radiation-sensitive image-recording layer formulation and optionally a hydrophilic protective layer formulation, followed by slitting or cutting (or both) to size to provide individual lithographic printing plate precursors having a shape or form having four right-angled corners (thus, typically in a square or rectangular shape or form). Typically, the cut individual precursors have a planar or generally flat rectangular shape.

Infrared Radiation-Sensitive Image-Recording Layer:

The infrared radiation-sensitive recording layer composition (and infrared radiation-sensitive image-recording layer prepared therefrom) according to the present invention is designed to be "negative-working" as that term is known in the lithographic art. In addition, the infrared radiation-sensitive image-recording layer can be designed with a certain combination of components to provide on-press developability to the lithographic printing plate precursor after exposure, for example to enable on-press development using a fountain solution, a lithographic printing ink, or a combination of the two.

The present invention utilizes component (1) a free radical initiator composition that is capable of generating free radicals upon exposure to infrared radiation. Such component (1) initiator composition can comprise one or more organohalogen compounds, for example trihaloalkyl compounds; halomethyl triazines; bis(trihalomethyl) triazines; or one or more onium salts such as iodonium salts, sulfonium salts, diazonium salts, phosphonium salts, and ammonium salts, many of which are known in the art as being capable of generating free radicals upon infrared radiation exposure. But it is essential that the (1) initiator composition comprise one or more iodonium cations, with or without other representative listed compounds.

Representative compounds other than onium salts are described for example in [0087] to [0102] of U.S. Patent Application Publication 2005/0170282 (Inno et al., US '282) and U.S. Pat. No. 6,309,792 (Hauck et al.), the disclosures of both of which are incorporated herein by reference including the numerous cited publications describing such compounds, and also in Japanese Patent Publication 2002/107916 and WO 2019/179995.

For example, the component (1) free radical initiator composition must include one or more iodonium cations. Useful onium salts are described for example from [0103] to [0109] of the cited publication US '282. For example, useful iodonium salts comprise at least one iodonium cation in the molecule, and a suitable anion. Examples of the iodonium salts include diaryliodonium salts such as diphenyliodonium salts, and derivatives thereof, that are obtained by introducing one or more substituents into the benzene ring of these compounds. Suitable substituents include but are not limited to, alkyl, alkoxy, alkoxycarbonyl, acyl, acyloxy, chloro, bromo, fluoro and nitro groups. Particularly useful iodonium cations such as diaryliodonium cations can have, for example two substituted or unsubstituted phenyl groups.

Examples of anions in iodonium salts include but are not limited to, halogen anions, $ClO_4^-$, $PF_6^-$, $BF_4^-$, $SbF_6^-$, $CH_3SO_3^-$, $CF_3SO_3^-$, $C_6H_5SO_3^-$, $CH_3C_6H_4SO_3^-$, $HOC_6H_4SO_3^-$, $ClC_6H_4SO_3^-$, and boron anions as described for example in U.S. Pat. No. 7,524,614 (Tao et al.), the disclosure of which is incorporated herein by reference. Representative useful iodonium salts are described in U.S. Pat. No. 7,524,614 (noted above) in Cols. 6-7 wherein the iodonium cation can contain various listed monovalent substituents "X" and "Y," or fused carbocyclic or heterocyclic rings with the respective phenyl groups.

Useful iodonium salts can be polyvalent iodonium salts having at least two iodonium cations in the molecule that are bonded through a covalent bond.

Furthermore, the iodonium salts described in paragraphs [0033] to [0038] of the specification of Japanese Patent Publication 2002-082429 [or U.S. Patent Application Publication 2002-0051934 (Ippei et al.)], the disclosure of which is incorporated herein by reference, are useful. Representative iodonium borate salts are those, for example, listed in Col. 8 of U.S. Pat. No. 7,524,614 (noted above).

In some embodiments, a combination of iodonium salts can be used as part of the component (1) free radical initiator composition, for example a combination of compounds described as Compounds A and Compounds B in U.S. Patent Application Publication 2017/0217149 (Hayashi et al.), the disclosure of which is incorporated herein by reference.

The component (1) free radical initiator composition used in the practice of the present invention must also include one or more electron-donating agents that not only participate in generation of free radicals for polymerization of the (2) free radically polymerizable compounds described below, but also facilitate the color changing reaction of the (3) color-changing compound described below. For example, electron-donating compounds that are particularly useful for the present invention include borate compounds and other organic compounds that desirably have an oxidation potential ($V_{ox}$) of less than 1.1 vs. an Ag/AgCl electrode Representative compounds that can act as electron-donating agents in the practice of this invention include but are not limited to, compounds having a partial structure in which a nitrogen atom, an oxygen atom, or a sulfur atom is directly bonded to an aromatic or heteroaromatic group. A skilled worker in chemistry would be able to design compounds having this feature in combination with the electrochemical feature described above. Some potentially useful electron-donating compounds are described in [0013] to [0015] of Japanese Patent Application Publication 2005/062482A. Examples of such compounds are described as A-1 through A-25 in [0017] to [0020] of this publication. A skilled worker using the teaching provided herein would be able to utilize routine experimentation to determine which is any of the compounds would be acceptable or optimal electron-donating compounds according to the present invention.

Particularly useful compounds that can be used as electron-donating agents include organic borate salts that are organic borate salts represented by the following Structure (III).

$[B(R^{10}R^{11}R^{12}R^{13})^-]_n M^{n+}$  Structure (III)

wherein $R^{10}$, $R^{11}$, $R^{12}$, and $R^{13}$ are independently substituted or unsubstituted alkyl groups, for example having 1 to 12 carbon atoms that can be substituted with one or more fluoro, chloro and bromo groups; or substituted or unsubstituted aryl groups having 6 to 10 carbon atoms in the aromatic rings and which can be substituted with one or more alkyl, alkenyl, alkoxy, alkoxycarbonyl, and acyloxy groups, one or two fluoro, chloro and bromo groups each on one or more of the aromatic rings, which the substituted or unsubstituted 6-membered aromatic (phenyl) groups being most useful. In most embodiments, at least three of $R^{10}$, $R^{11}$, $R^{12}$, and $R^{13}$ are the same or different substituted or unsubstituted aryl groups as defined above, and in the best embodiments, all of $R^{10}$, $R^{11}$, $R^{12}$, and $R^{13}$ are the same substituted or unsubstituted phenyl groups, and for example, with all of these groups being the same substituted phenyl group.

Moreover, consistent with Structure (IIIa) described herein, each of the substituted aryl groups in Structure (III) has no more than two halo substituents.

In Structure (III), n is an integer equal to or greater than 1; and $M^{n+}$ is an n-valent cation, such as but not limited to, monovalent alkali metal cations, ammonium cations, monomeric and polymeric onium cations, such as iodonium, sulfonium, or diazonium cations, or any other inorganic or organic molecule with cationic charge including cyanine dyes with cationic charge. In some embodiments, $M^{n+}$ can represent one or more molecules of an iodonium cation such one or more molecules or a diaryliodonium cation, as described above.

If other components in the infrared radiation-sensitive image-recording layer do not comprise a borate compound as represented by Structure (III) above, such a borate compound must be present in the component (1) free radical initiator composition.

The one or more electron-donating agents useful in the present invention are present in the infrared radiation-sensitive image-recording layer in an amount of at least 0.5 weight % or at least 1 weight % and up to and including 10 weight %, or up to and including 20 weight %, based on the total coverage (solids) of the infrared radiation-sensitive image-recording layer.

The component (1) free radical initiator composition are present in the infrared radiation-sensitive image-recording layer in amounts (molar or weight ratios) that would be readily apparent to a skilled worker in the art of preparing on-press developable lithographic printing plate precursors, and the minimum and maximum total amounts are generally at least 1 weight % and up to and including 20 weight % of all components including the electron-donating agent and iodonium cations, based on the total coverage (solids) of the infrared radiation-sensitive image-recording layer.

Since the component (1) free radical initiator composition can have multiple components it would be readily apparent to one skilled in the art as to the useful amount(s) or dry coverage of the various components of the component (1) free radical initiator composition in the infrared radiation-sensitive image-recording layer, based on the knowledge of a skilled artisan and the representative teaching provided herein including the working examples shown below. Useful component (1) free radical initiator composition materials can be readily obtained from commercial sources in the world, or readily prepared using known starting materials and synthetic methods carried out by a skilled synthetic chemist, and then mixed in appropriate molar or weight ratios for use in the present invention.

Another essential feature of the infrared radiation-sensitive image-recording layer is a component (2) free radically polymerizable composition that comprises one or more free radically polymerizable components, each of which contains one or more free radically polymerizable groups that can be polymerized using free radical initiation during infrared radiation exposure. In some embodiments, at least two free radically polymerizable components, having the same or different numbers of free radically polymerizable groups in each molecule, are present. Thus, useful free radically polymerizable components can contain one or more free radical polymerizable monomers or oligomers having one or more polymerizable ethylenically unsaturated groups (for example, two or more of such groups). Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

It is possible for one or more free radically polymerizable components to have large enough molecular weight or to have sufficient polymerizable groups to provide a crosslinkable polymer matrix that functions as a "polymeric binder" for other components in the infrared radiation-sensitive image-recording layer. In such embodiments, a distinct (6) non-free radically polymerizable polymer material (described below) is not necessary but can still be present if desired.

Useful free radically polymerizable components include urea urethane (meth)acrylates or urethane (meth)acrylates having multiple (two or more) polymerizable groups. For example, urethane acrylates having two up to fifteen acrylate groups can be prepared by reacting a triisocyanate such as DESMODUR® N100 (Bayer Corp., Milford, Conn.) or a diisocyanate such as hexane-1,6-diisocyanate with hydroxyethyl acrylate, pentaerythritol triacrylate or dipentaerythritol pentaacrylate. Such urethane or urea (meth)acrylate compounds have the number of (meth)acrylate groups per molecule as high as fifteen or more. Commercially available urethane acrylates having fifteen acrylate groups include U-15HA and UA-53H available from Shin-Nakamura Chemical Co. Ltd. These compounds with large number of (meth)acrylates can be included in the (2) free radically polymerizable composition for their high crosslinking efficiency.

Useful free radically polymerizable compounds include non-urethane and non-urea (meth)acrylates derived from polyfunctional alcohols such as NK Ester A-DPH (dipentaerythritol hexaacrylate) that is available from Kowa American, and Sartomer SR399 (dipentaerythritol pentaacrylate), Sartomer 355 (di-trimethylolpropane tetraacrylate), Sartomer SR295 (pentaerythritol tetraacrylate), Sartomer SR415 [ethoxylated (20)trimethylolpropane triacrylate], Sartomer SR494 (ethoxylated pentaerythritol tetraacrylate) that are available from Sartomer Company, Inc. These non-urethane and non-urea (meth)acrylates can also have a large number of (meth)acrylate groups per molecule.

Mixtures of urethane or urea (meth)acrylate) and non-urethane and non-urea (meth)acrylates can be used in the (2) free radically polymerizable composition. In some embodiments, mixtures of compounds with different number of (meth)acrylate groups can be used.

Numerous other free radically polymerizable components are known in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*. S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.), the disclosures of all of which are incorporated herein by reference. Other useful free radically polymerizable components include those described in U.S. Patent Application Publication 2009/0142695 (Baumann et al.), which radically polymerizable components include 1H-tetrazole groups, and the disclosure of which publication is incorporated herein by reference.

The one or more components of the component (2) free radically polymerizable composition are generally present in a total amount of at least 10 weight % or of at least 20 weight %, and up to and including 50 weight %, or up to and including 70 weight %, all based on the total coverage (solids) of the infrared radiation-sensitive image-recording layer.

Useful free radically polymerizable components for the component (2) free radically polymerizable composition can be obtained from various commercial sources in the world, or they can be readily prepared using known starting materials and synthetic methods carried out by skilled synthetic chemists.

A third essential component of the infrared radiation-sensitive image-recording composition and image-recording layer according to the present invention is a component (3) color-changing compound, or a mixture of two or more thereof, each of which is represented by the following Structure (I):

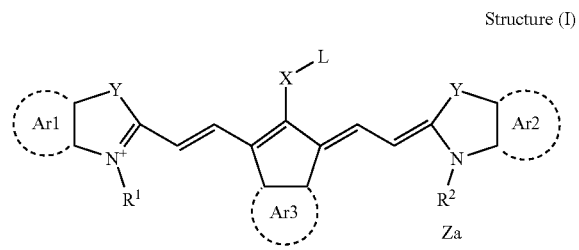

Structure (I)

wherein Ar1, Ar2, and Ar3 independently represent the atoms necessary to complete substituted or unsubstituted aromatic rings or to complete substituted or unsubstituted heteroaromatic rings. Thus, in general, an appropriate number of carbon atoms is required to complete a substituted or unsubstituted aromatic ring for any or all of Ar1, Ar2, and Ar3, such as for the completion of benzene (benzo) or naphthalene (naphtho) rings. Moreover, an appropriate number of carbon and one or more heteroatoms are required to complete a substituted or unsubstituted heteroaromatic ring for any or all of Ar1, Ar2, and Ar3, such as for completion of a pyridin-2-yl, pyridin-3-yl, pyridin-4-yl, pyridazinyl, pyrimidin-2-yl, pyrimidin-4-yl, pyrimidin-5-yl, or pyrimidin-6-yl, pyrazine, triazine, pyrrol, furan, thiophene, pyrazole or oxazole, imidazole, thiazole, or triazole ring.

In many useful embodiments of this invention, Ar1 and Ar2 are the same atoms necessary to complete substituted or unsubstituted aromatic rings, for example, the same substituted or unsubstituted aromatic rings such as substituted or unsubstituted benzene (benzo) rings. Moreover, one or both of the aromatic rings completed by the atoms of Ar1 and Ar2 can be substituted, for example, with one or more the same or different optionally substituted alkyl groups, alkoxy groups, halo groups (for example, one or two of the same or different halo groups), cyano groups, —COOR' group, —SO$_3$R' group, or —SO$_2$R' group, wherein R' represents a substituted or unsubstituted alkyl group, that can be the same or different for each of the noted groups. It is also desirable that Ar3 represent the carbon atoms needed to complete a benzene (benzo) ring in Structure (I).

Further, in Structure (I), Y represents an oxygen atom, a sulfur atom, or a dialkylmethylene group represented by >C(R$^4$R$^5$) wherein R$^4$ and R$^5$ are independently substituted or unsubstituted alkyl groups having 1 to 4 carbons. In many useful embodiments of the present invention, each representation of Y is the same or different dialkylmethylene group, or even the same dialkylmethylene group wherein R$^4$ and R$^5$ are the same unsubstituted alkyl group having 1 or 2 carbon atoms. A skilled chemist would be able to make numerous compounds wherein Y is varied among the possible groups, including the many possible dialkylmethylene groups.

In Structure (I), R$^1$ and R$^2$ are independently substituted or unsubstituted alkyl groups, each of which has from 1 to 12 carbon atoms, and in many embodiments, one or both of such alkyl groups can comprise the same or different ether or ester linkages that interrupt the carbon chain, or in the case of ester groups, they can be used to terminate the alkyl chain.

Further, in Structure (I), X represents a single bond or a divalent linking group selected from —S—, —O—, and >N(R$^6$) wherein R$^6$ is hydrogen, a substituted or unsubstituted alkyl group having 1 to 12 carbon atoms, a substituted or unsubstituted aryl group, a substituted or unsubstituted heteroaryl group, or L (as defined below). In particular embodiments of the invention, X represents the >N(R$^6$) group as defined above, and particularly wherein R$^6$ is hydrogen or an unsubstituted alkyl group having 1 to 8 carbon atoms.

In addition, in Structure (I), L represents a —C(═O)—OR$^7$ group, —SO$_2$—R$^3$ group, or —SO$_2$NR$^8$R$^9$ group, wherein R$^7$ represents a substituted or unsubstituted alkyl group having 1 to 8 carbon atoms including a secondary or tertiary connecting carbon that connects to the rest of the —C(═O)—OR$^7$ group. R$^3$, R$^8$, and R$^9$ independently represent substituted or unsubstituted alkyl groups having 1 to 12 carbon atoms, substituted or unsubstituted aryl groups having 6 or 10 carbon atoms in the aromatic ring, or substituted or unsubstituted heteroaryl groups. In addition, R$^3$ can be a haloalkyl group having 1 to 12 carbon atoms, wherein one or more of the hydrogen atoms are replaced with halogen atoms. In some embodiments, L comprises an electron withdrawing group capable of undergoing redox reactions with the electron-donating agent in the (1) free radical initiator composition described above. In particular embodiments of the present invention, L is a —SO$_2$—R$^3$ group wherein R$^3$ is an unsubstituted alkyl group having 1 or 2 carbon atoms or a fluoroalkyl having 1 or 2 carbon atoms and at least one hydrogen atom replaced with a fluoro atom. For example, R$^3$ can be a trifluoromethyl group.

Lastly, in Structure (I), Za represents one or more counter ions to balance the electric charge in the rest of the color-changing compound according to Structure (I). When the rest of the color-changing compound according to Structure (I) is positively charged, Za represent an anion. Many useful anions are known in the art, for example, halogen anions, ClO$_4$$^-$, PF$_6$$^-$, BF$_4$$^-$, SbF$_6$$^-$, CH$_3$SO$_3$$^-$, CF$_3$SO$_3$$^-$; C$_6$H$_5$SO$_3$$^-$, CH$_3$C$_6$H$_4$SO$_3$$^-$, HOC$_6$H$_4$SO$_3$$^-$, ClC$_6$H$_4$SO$_3$$^-$, and boron-containing anions as described for example in U.S. Pat. No. 7,524,614 (noted above). Useful boron-containing anions include tetraaryl borate anions (such as tetraphenyl borate) as described above for the electron-donating agent. In some embodiments, Za can be supplied by the electron-donating agent in the (1) free radical initiator composition. When the rest of the color-changing compound according to Structure (I) is negatively charged, Za represents a cation. Useful cations are known in the art, for example, alkali metal ions, alkali earth metal ions, tertiary and quaternary ammonium ions, and onium ions such as an iodonium ion, sulphonium ion, or phosphonium ion. In some embodiments, Za can be supplied by the onium compounds in component (1) free radical initiator composition as described above.

Some particularly useful embodiments of the component (3) color-changing compounds are represented by the following Structure (II):

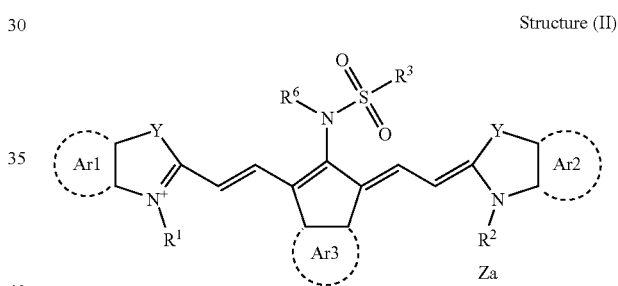

Structure (II)

wherein Ar1, Ar2, Ar3, R$^1$, R$^2$, R$^3$, R$^6$, Y, and Za are as defined above.

While not wishing to be bound by a particular theory, it is believed that Ar3 in Structure (I) or in Structure (II) affects the geometry of the polymethine chain in the component (3) color-changing compound and thus makes it more reactive in the presence of the organic borate salt according to Structure (III) as part of component (1). For example, in the presence of the tetraphenyl borate anion, a compound [Inventive (3) color-changing compound 2, or ICCC-2, shown below] according to Structure (I) or Structure (II) can undergo a chemical reaction (shown below) to form a phenylation production ICCC 2-Ph during or after irradiation of the infrared radiation-sensitive image-recording layer by a suitable infrared source. The UV-vis spectrum of ICCC 2-Ph in methanol has an absorption peak around 514 nm, which is quite different from the absorption peak of ICCC 2 at 770 nm. Phenylation of the inventive (3) color-changing compound is also possible through reaction with triphenyl-alkyl borate salt such as the triphenyl-n-butyl borate salt and the tris(3-fluorophenyl)-n-butyl borate salt.

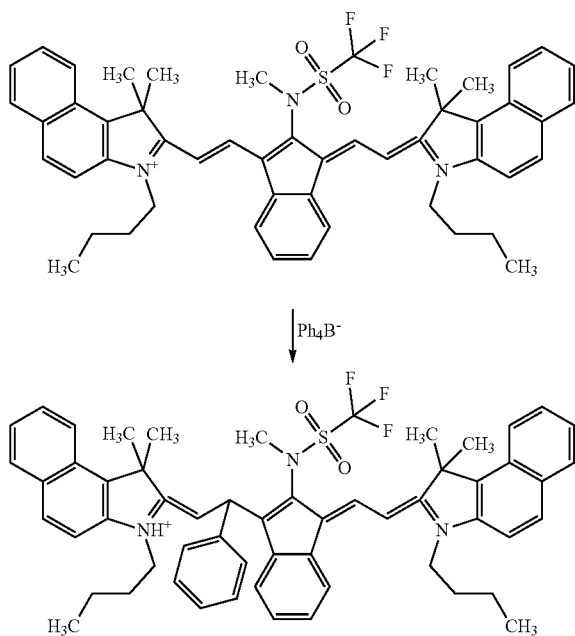

The phenylation product such as ICCC 2-Ph is stable at room temperature for at least a week in the infrared radiation exposed regions of the infrared radiation-sensitive image-recording layer and thus provides a stable printout to the infrared radiation-exposed lithographic printing plate precursor. Furthermore, in the presence of sufficient amount of a borate compound according to Structure (III) above, the phenylation product can be formed at much lower input of the infrared radiation energy than what is typically required of a decomposition reaction involving the cleavage of a leaving group as described in many prior art listed in the section of the Background of the Invention above. In addition, the phenylation reaction provides much bigger shift in the absorption peaks in the visible spectrum than the decomposition reaction, which is useful for producing large color differences. For example, phenylation reaction of ICCC-2 provides a peak shift of ~256 nm while the decomposition reaction of ICCC-2 provides a peak shift of 140 nm and forms a product as shown below (λmax in methanol ~632 nm).

ICCC 2-D

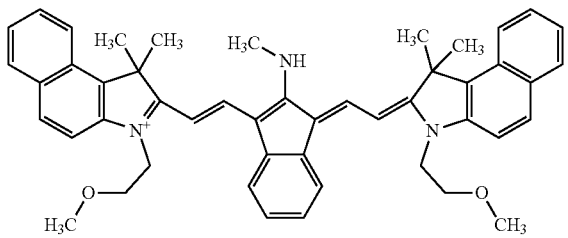

As another example, the following decomposition reaction involving a decomposable infrared dye that is outside the scope of Structure (I) can only produce a peak shift of 164 nm, requires high energy input, and produces gaseous by-products.

In an infrared radiation-sensitive recording layer having both a color-changing compound according to Structure (I) or Structure (II) and a borate compound according to Structure (III), both a phenylation reaction and decomposition can occur. At an exposure energy level about 110 mJ/cm² as is typically used in current high speed plate-making environments, the amount of the phenylation products relative to decomposition products and thus the printout metrics (for example, ΔE color difference between exposed and unexposed region) depend on the amount of the borate compound available for the phenylation reaction. Since the borate compound can also participate in reactions with iodonium cations to generate free radical generation, the amount of the borate compound available for the phenylation reaction depends upon both the amounts of the borate compounds and the iodonium cations. Thus, in order to produce adequate printout values at a 110 mJ/cm² exposure energy, the molar ratio of the one or more borate anions to the one or more iodonium cations in the infrared radiation-sensitive image-recording layer must be at least 0.5:1. It is more desirable that this molar ratio is at least 0.8:1 and up to and including 4:1.

Even in the presence of a sufficient amount of the borate compound, Ar3 in both Structure (I) and Structure (II) is still essential. Without it in a decomposable infrared dye, the phenylation reaction will be inefficient, if it occurs at all.

The component (3) color-changing compound, singly or mixture of two or more thereof, are generally present in the infrared radiation-sensitive image-recording layer in an amount of at least 0.5 weight %, or at least 1 weight % and up to and including 10 weight % or up to and including 15 weight %, based on the total weight of that infrared radiation-sensitive image-recording layer.

Thus, it is essential that the infrared radiation-sensitive image-recording layer contains sufficient one or more iodonium cations and one or more borate anions such that the molar ratio of the one or more borate anions to the one or more iodonium cations is at least 0.5:1 or at least 0.8:1, and up to and including 2:1 or up to and including 4:1. The one or more borate anions are represented by following Structure (IIIa):

$$B(R^{10}R^{11}R^{12}R^{13})^- \qquad \text{Structure (IIIa)}$$

wherein $R^{10}$, $R^{11}$, $R^{12}$, and $R^{13}$ are independently substituted or unsubstituted alkyl groups or substituted or unsubstituted aryl groups, provided that at least three of $R^{10}$, $R^{11}$, $R^{12}$, and $R^{13}$ are the same or different substituted or unsubstituted aryl groups, and the substituted aryl groups each have no more than two halo substituents.

The one or more iodonium cations can be provided to the infrared radiation-sensitive image-recording layer as part of the (1) free radical initiator composition. However, the one or more borate anions can be provided to the infrared radiation-sensitive image-recording layer in various ways. For example, the one or more borate anions can be provided as part of one or more iodonium salts in the (1) free radical initiator composition. Alternatively, one or more borate anions can be provided as one or more Za counterions in Structure (I) or in Structure (II) or as part of a component (4) infrared absorbing material described below. Still again, the one or more borate anions can be provided as separate borate salts in the (1) free radical initiator composition.

While not essential, but highly desirable, the infrared radiation-sensitive image-recording layer according to the present invention can also include a component (4) infrared absorbing material (one or a mixture of two or more thereof) that is different from the component (3) color-changing compounds described above. The (4) infrared radiation absorber provides desired infrared radiation sensitivity or convert radiation to heat, or both. Useful infrared radiation absorbers can be pigments or infrared radiation absorbing dyes. Suitable dyes are those described in for example, U.S. Pat. No. 5,208,135 (Patel et al.), U.S. Pat. No. 6,153,356 (Urano et al.), U.S. Pat. No. 6,309,792 (Hauck et al.), U.S. Pat. No. 6,569,603 (Furukawa), U.S. Pat. No. 6,797,449 (Nakamura et al.), U.S. Pat. No. 7,018,775 (Tao), U.S. Pat. No. 7,368,215 (Munnelly et al.), U.S. Pat. No. 8,632,941 (Balbinot et al.), and U.S. Patent Application Publication 2007/056457 (Iwai et al.), the disclosures of all of which are incorporated herein by reference. In some infrared radiation-sensitive embodiments, it is desirable that at least one (4) infrared radiation absorber in the infrared radiation-sensitive image-recording layer is a cyanine dye comprising a suitable cationic cyanine chromophore and a tetraarylborate anion such as a tetraphenylborate anion. Examples of such dyes include those described in United States Patent Application Publication 2011/003123 (Simpson et al.), the disclosure of which is incorporated herein by reference.

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

The total amount of the component (4) infrared radiation absorber is at least 0.5 weight % or at least 1 weight %, and up to and including 15 weight %, or up to and including 30 weight %, based on the total weight of the infrared radiation-sensitive image-recording layer.

Useful component (4) infrared radiation absorbers can be obtained from various commercial sources in the world, or they can be prepared using chemical synthetic methods and starting materials known to a synthetic chemist of ordinary skill in the art.

Another optional but desirable component of the infrared radiation-sensitive image-recording layer is a component (5) acid-sensitive dye precursor (for example, singly or a combination of two or more thereof). Useful component (5) acid-sensitive dye precursors are compounds that are colorless or nearly colorless in the neutral form and that switch to a colored form when protonated. Many leuco dyes are known for this purpose including those described in for example, in [0209] to [0222] of EP 3,418,332A2 (Inasaki et al., corresponding to U.S. Patent Application Publication 2018/0356730, the disclosure of which is incorporated herein by reference), and in [0044] to [0046] of EP 2,018,365B1 (Nguyen et al., corresponding to U.S. Pat. No. 7,910,768, the disclosure of which is incorporated herein by reference). These component (5) acid-sensitive dye precursors are different from all of the components (1), (2), (3), and (4) defined above.

For example, in some embodiments, at least one of the component (5) acid-sensitive dye precursors comprises a lactone substructure. More particularly, useful component (5) acid-sensitive dye precursors can be represented by one or more of the following Structure (C1) and Structure (C2):

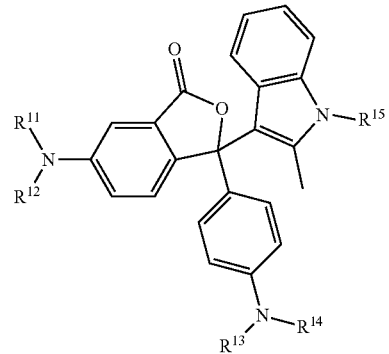

Structure (C1)

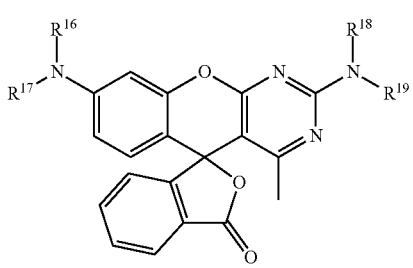

Structure (C2)

wherein $R^{11}$ through $R^{19}$ are independently hydrogen, unsubstituted or substituted alkyl groups, or unsubstituted or substituted aryl groups. Such substituted or unsubstituted alkyl groups can have 1 to 20 carbon atoms, and possibly one or more substituents can include but are not limited to halogen, alkyl, aryl, alkoxy, and phenoxy groups. Useful substituted or unsubstituted aryl groups can be carbocyclic aromatic rings or heterocyclic aromatic rings, and such groups can have two or more fused rings. Useful substituents for the aryl rings can include but are not limited to, those described above for the alkyl groups. However, skilled chemists could design other useful component (5) acid-sensitive dye precursors using this teaching about Structures (C1) and (C2) as guidance.

As noted above, such component (5) acid-sensitive dye precursor can be present if desired, in any desired amount of at least 0.5 weight % and up to and including 10 weight %, based on the total coverage (solids) of the infrared radiation-sensitive image-recording layer.

Useful component (5) acid-sensitive dye precursors can be obtained from various commercial sources or prepared using starting materials and synthetic procedures known to a synthetic chemist having ordinary skill in the art.

It is also optional but desirable in many embodiments of the present invention that the infrared radiation-sensitive image-recording layer further comprises a component (6) non-free radically polymerizable polymeric material (or polymeric binder), or a mixture of two or more thereof, each of which does not have any functional groups that, if present, would make the polymeric material capable of free radical polymerization. Thus, such component (6) non-free radically polymerizable polymeric material is different from all of components (1), (2), (3), and (4) described above.

A useful component (6) non-free radically polymerizable polymeric material generally has a weight average molecular weight (Mw) of at least 2,000 g/mol, or at least 20,000 g/mol, and up to and including 300,000 g/mol or up to and including 500,000 g/mol, as determined by Gel Permeation Chromatography (polystyrene standard).

Such component (6) non-free radically polymerizable polymeric material can be selected from polymeric binder materials known in the art including polymers comprising recurring units having side chains comprising polyalkylene oxide segments such as those described in for example, U.S. Pat. No. 6,899,994 (Huang et al.) the disclosure of which is incorporated herein by reference. Other useful polymeric binders comprise two or more types of recurring units having different side chains comprising polyalkylene oxide segments as described in for example WO Publication 2015-156065 (Kamiya et al.). Some of such polymeric binders can further comprise recurring units having pendant cyano groups as those described in for example U.S. Pat. No. 7,261,998 (Hayashi et al.), the disclosure of which is incorporated herein by reference.

Such component (6) polymeric non-free radically polymerizable material also can have a backbone comprising multiple (at least two) urethane moieties as well as pendant groups comprising the polyalkylenes oxide segments.

A useful component (6) non-free radically polymerizable polymeric material can be present in particulate form, that is, in the form of discrete particles (non-agglomerated particles). Such discrete particles can have an average particle size of at least 10 nm and up to and including 1500 nm, or typically of at least 80 nm and up to and including 600 nm, and are generally distributed uniformly within the infrared radiation-sensitive image-recording layer. Some of these materials can be present in particulate form and have an average particle size of at least 50 nm and up to and including 400 nm. Average particle size can be determined using various known methods and nanoparticle measuring equipment, including measuring the particles in electron scanning microscope images and averaging a set number of measurements.

In some embodiments, the component (6) non-free radically polymerizable polymeric material can be present in the form of particles having an average particle size that is less than the average dry thickness (t) of the infrared radiation-sensitive image-recording layer. The average dry thickness (t) in micrometers (μm) is calculated by the following Equation:

$$t = w/r$$

wherein w is the dry coating coverage of the infrared radiation-sensitive image-recording layer in g/m² and r is 1 g/cm³.

The component (6) non-free radically polymerizable polymeric material(s) can be present in an amount of at least 10 weight %, or at least 20 weight %, and up to and including 50 weight %, or up to and including 70 weight %, based on the total coverage (solids) of the infrared radiation-sensitive image-recording layer.

Useful component (6) non-free radically polymerizable polymeric material can be obtained from various commercial sources or they can be prepared using known procedures and starting materials, as described for example in publications described above and as known by polymer chemists or ordinary skill in the art.

The infrared radiation-sensitive image-recording layer used in the present invention can also optionally include crosslinked polymer particles, such materials having an average particle size of at least 2 μm, or of at least 4 μm, and up to and including 20 μm as described for example in U.S. Pat. No. 9,366,962 (Hayakawa et al.), U.S. Pat. No. 8,383,319 (Huang et al.), and U.S. Pat. No. 8,105,751 (Endo et al), the disclosures of all of which are incorporated herein by reference. Such crosslinked polymeric particles can be present only in the infrared radiation-sensitive image-recording layer, only in the hydrophilic protective layer when present (described below), or in both the infrared radiation-sensitive image-recording layer and the hydrophilic protective layer when present.

The infrared radiation-sensitive image-recording layer can also include a variety of other optional addenda including but not limited to, dispersing agents, humectants, biocides, plasticizers, surfactants for coatability or other properties, viscosity builders, pH adjusters, drying agents, defoamers, development aids, rheology modifiers, or combinations thereof, or any other addenda commonly used in the lithographic coating art, in conventional amounts. The infrared radiation-sensitive image-recording layer can also include a phosphate (meth)acrylate having a molecular weight generally greater than 250 as described in U.S. Pat. No. 7,429,445 (Munnelly et al.), the disclosure of which is incorporated herein by reference.

Moreover, the infrared radiation-sensitive image-recording layer can optionally comprise one or more suitable chain transfer agents, antioxidants, or stabilizers to prevent or moderate undesired radical reactions. Suitable antioxidants and inhibitors for this purpose are described, for example in [0144] to [0149] of EP 2,735,903B1 (Werner et al.) and in Cols. 7-9 of U.S. Pat. No. 7,189,494 (Munnelly et al.), the disclosure of which is incorporated herein by reference.

The useful dry coverage (typically total solids with minimal water and organic solvents) of the infrared radiation-sensitive image-recording layer is described below.

Hydrophilic Protective Layer:

While in some embodiments of the present invention, the infrared radiation-sensitive image-recording layer is the outermost layer with no layers disposed thereon, it is possible that the precursors according to this invention can be designed with a hydrophilic protective layer (also known in the art as a hydrophilic overcoat, oxygen-barrier layer, or topcoat) disposed directly on the single infrared radiation-sensitive image-recording layer (with no intermediate layers between these two layers), especially if the imaged precursor is designed for off-press development (described below).

When present, this hydrophilic protective layer is generally the outermost layer of the precursor and thus, when multiple precursors are stacked one on top of the other, the hydrophilic protective layer of one precursor can be in contact with the backside of the substrate of the precursor immediately above it, where no interleaving paper is present.

Such hydrophilic protective layers can comprise one or more film-forming water-soluble polymeric binders in an amount of at least 60 weight % and up to and including 100 weight %, based on the total dry weight of the hydrophilic protective layer. Such film-forming water-soluble (or hydrophilic) polymeric binders can include a modified or unmodified poly(vinyl alcohol) having a saponification degree of at least 30%, or a degree of at least 75%, or a degree of at least 90%, and a degree of up to and including 99.9%.

Further, one or more acid-modified poly(vinyl alcohol) s can be used as film-forming water-soluble (or hydrophilic) polymeric binders in the hydrophilic protective layer. For example, at least one poly(vinyl alcohol) can be modified with an acid group selected from the group consisting of carboxylic acid, sulfonic acid, sulfuric acid ester, phosphonic acid, and phosphoric acid ester groups. Examples of useful modified poly(vinyl alcohol) materials include but are not limited to, sulfonic acid-modified poly(vinyl alcohol), carboxylic acid-modified poly(vinyl alcohol), and quaternary ammonium salt-modified poly(vinyl alcohol), glycol-modified poly(vinyl alcohol), or combinations thereof.

The optional hydrophilic overcoat can also include crosslinked polymer particles having an average particle size of at least 2 μm and as noted above.

When present, the hydrophilic protective layer is provided as a hydrophilic protective layer formulation and dried to provide a dry coating coverage of at least 0.1 $g/m^2$ and up to but less than 4 $g/m^2$, or typically at a dry coating coverage of at least 0.15 $g/m^2$ and up to and including 2.5 $g/m^2$. In some embodiments, the dry coating coverage is as low as 0.1 $g/m^2$ and up to and including 1.5 $g/m^2$ or at least 0.1 $g/m^2$ and up to and including 0.9 $g/m^2$, such that the hydrophilic protective layer is relatively thin for easy removal during off-press development or on-press development.

The hydrophilic protective layer can optionally comprise organic wax particles dispersed, generally uniformly, within the one or more film-forming water-soluble (or hydrophilic) polymeric binders as described for example in U.S. Patent Application Publication 2013/0323643 (Balbinot et al.), the disclosure of which is incorporated herein by reference.

Preparing Lithographic Printing Plate Precursors:

The lithographic printing plate precursors according to the present invention can be provided in the following manner. An infrared radiation-sensitive image-recording layer formulation comprising essential components (1), (2), (3), and the required one or more iodonium cations and the one or more borate anions, and optional components (4), (5), (6), and other optional addenda, described above, can be applied to a hydrophilic surface of a suitable aluminum-containing substrate, usually in the form of a continuous web, as described above, using any suitable equipment and procedure, such as spin coating, knife coating, gravure coating, die coating, slot coating, bar coating, wire rod coating, roller coating, or extrusion hopper coating. Such formulation can also be applied by spraying onto a suitable substrate. Typically, once the infrared radiation-sensitive image-recording layer formulation is applied at a suitable wet coverage, it is dried in a suitable manner known in the art to provide a desired dry coverage as noted below, thereby providing an infrared radiation-sensitive continuous web or an infrared radiation-sensitive continuous article. The components and addenda of the infrared radiation-sensitive image-recording layer can be designed such that upon, imaging, this layer is readily removed on-press using either or a combination of a lithographic printing ink and a fountain solution.

As noted above, before the infrared radiation-sensitive image-recording layer formulation is applied, the substrate (that is, a continuous roll or web) can be electrochemically grained and anodized as described above to provide a suitable hydrophilic anodic (aluminum oxide) layer on the outer surface of the aluminum-containing support, and the anodized surface usually can be post-treated with a hydrophilic polymer solution as described above. The conditions and results of these operations are well known in the art as described above. The manufacturing methods typically include mixing the various components needed for the infrared radiation-sensitive image-recording layer in a suitable organic solvent or mixtures thereof with or without water [such as methyl ethyl ketone (2-butanone), methanol, ethanol, 1-methoxy-2-propanol, 2-methoxypropanol, isopropyl alcohol, acetone, γ-butyrolactone, n-propanol, tetrahydrofuran, and others readily known in the art, as well as mixtures thereof], applying the resulting infrared radiation-sensitive image-recording layer formulation to a continuous substrate web, and removing the solvent(s) by evaporation under suitable drying conditions.

After proper drying, the dry coverage of the infrared radiation-sensitive image-recording layer on the substrate can be at least 0.1 $g/m^2$, or at least 0.4 $g/m^2$, and up to and including 2 $g/m^2$ or up to and including 4 $g/m^2$ but other dry coverage amounts can be used if desired, to provide a desired dry coverage.

As described above, in some embodiments, a suitable aqueous-based hydrophilic protective layer formulation (described above) can be applied to the dried infrared radiation-sensitive image-recording layer using known coating and drying conditions, equipment, and procedures.

In practical manufacturing conditions, the result of these coating operations is a continuous radiation-sensitive web (or roll) of infrared radiation-sensitive lithographic printing plate precursor material having either only a single infrared radiation-sensitive image-recording layer or both a single infrared radiation-sensitive image-recording layer and a hydrophilic protective layer disposed as the outermost layer. Such continuous radiation-sensitive web can be slit or cut into appropriately sized precursors for use.

Imaging (Exposing) Conditions

During use, an infrared radiation-sensitive lithographic printing plate precursor of this invention can be exposed to a suitable source of infrared radiation depending upon the infrared radiation absorber(s) present in the infrared radiation-sensitive image-recording layer. In some embodiments, the lithographic printing plate precursors can be imaged with one or more infrared radiation-emitting lasers that emit significant infrared radiation within the range of at least 750 nm and up to and including 1400 nm, or of at least 800 nm and up to and including 1250 nm to create exposed regions and non-exposed regions in the infrared radiation-sensitive image-recording layer. Such infrared radiation-emitting lasers can be used for such imaging in response to digital information supplied by a computing device or other source of digital information. The laser imaging can be digitally controlled in a suitable manner known in the art.

Thus, imaging can be carried out using imaging or exposing infrared radiation from an infrared radiation-generating laser (or array of such lasers). Imaging also can be carried out using imaging radiation at multiple infrared (or near-IR) wavelengths at the same time if desired. The laser(s) used to expose the precursor is usually a diode laser(s), because of the reliability and low maintenance of diode laser systems, but other lasers such as gas or solid-state lasers can also be used. The combination of power, intensity and exposure time for infrared radiation imaging would be readily apparent to one skilled in the art.

The infrared imaging apparatus can be configured as a flatbed recorder or as a drum recorder, with the infrared radiation-sensitive lithographic printing plate precursor mounted to the interior or exterior cylindrical surface of the drum. An example of useful imaging apparatus is available as models of KODAK® Trendsetter platesetters (Eastman Kodak Company) and NEC AMZISetter X-series (NEC Corporation, Japan) that contain laser diodes that emit radiation at a wavelength of about 830 nm. Other suitable imaging apparatus includes the Screen PlateRite 4300 series or 8600 series platesetters (available from Screen USA, Chicago, IL) or thermal CTP platesetters from Panasonic Corporation (Japan) that operates at a wavelength of 810 nm.

It can be desirable to include a means for reducing or removing ozone in the environment of the laser imaging if the infrared radiation-sensitive image-recording layer is sensitive to the presence of ozone. Useful means and system for doing this is described for example in U.S. Patent Application Publication 2019/0022995 (Igarashi et al.), the disclosure of which is incorporated herein by reference.

When an infrared radiation imaging source is used, imaging intensities can be at least 30 mJ/cm² and up to and including 500 mJ/cm² and typically at least 50 mJ/cm² and up to and including 300 mJ/cm² depending upon the sensitivity of the infrared radiation-sensitive image-recording layer.

Processing (Development) and Printing

After imagewise exposing as described above, the exposed infrared radiation-sensitive lithographic printing plate precursors having exposed regions and non-exposed regions in the infrared radiation-sensitive image-recording layer can be processed on-press to remove the non-exposed regions (and any hydrophilic protective layer over such regions). During this processing, and during lithographic printing, the revealed hydrophilic substrate surface repels inks while the remaining exposed regions accept lithographic printing ink.

Thus, the negative-working lithographic printing plate precursors of the present invention are on-press developable using a lithographic printing ink, a fountain solution, or a combination of a lithographic printing ink and a fountain solution. In such embodiments, an imaged (exposed) infrared radiation-sensitive lithographic printing plate precursor according to the present invention is mounted onto a printing press and the printing operation is begun. The non-exposed regions in the infrared radiation-sensitive image-recording layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, IL).

In a typical printing press startup with a sheet-fed printing machine, the dampening roller is engaged first and supplies fountain solution to the mounted imaged precursor to swell the exposed infrared radiation-sensitive image-recording layer at least in the non-exposed regions. After a few revolutions the inking rollers are engaged and they supply lithographic printing ink(s) to cover the entire printing surface of the lithographic printing plates. Typically, within 5 to 20 revolutions after the inking roller engagement, printing sheets are supplied to remove the non-exposed regions of the infrared radiation-sensitive image-recording layer from the lithographic printing plate as well as materials on a blanket cylinder if present, using the formed ink-fountain solution emulsion.

On-press developability of infrared radiation exposed lithographic printing precursors is particularly useful when the precursor comprises one or more polymeric binder materials (whether free radically polymerizable or not) in an infrared radiation-sensitive image-recording layer, at least one of which polymeric binders is present as particles having an average diameter of at least 50 nm and up to and including 400 nm.

The present invention provides at least the following embodiments and combinations thereof, but other combinations of features are considered to be within the present invention as a skilled artisan would appreciate from the teaching of this disclosure:

1. A lithographic printing plate precursor comprising:
a substrate, and
an infrared radiation-sensitive image-recording layer disposed on the substrate, the infrared radiation-sensitive image-recording layer comprising the following components (1), (2), and (3):
(1) a free radical initiator composition that is capable of generating free radicals upon exposure to infrared radiation, and which comprises an electron-donating agent and one or more iodonium cations;
(2) a free radically polymerizable composition; and
(3) a color-changing compound that is represented by the following Structure (I)

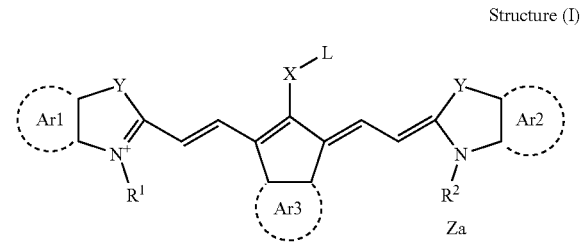

Structure (I)

wherein:
Ar1, Ar2, and Ar3 independently represent the atoms necessary to complete substituted or unsubstituted aromatic rings or to complete substituted or unsubstituted heteroaromatic rings;
Y represents an oxygen atom, a sulfur atom, or a dialkylmethylene group represented by >C($R^4R^5$) wherein $R^4$ and $R^5$ are independently substituted or unsubstituted alkyl groups having 1 to 4 carbons;
$R^1$ and $R^2$ are independently substituted or unsubstituted alkyl groups;
X represents a single bond or a divalent linking group selected from —S—, —O—, and >N($R^6$) wherein $R^6$ is hydrogen, a substituted or unsubstituted alkyl group, a substituted or unsubstituted aryl group, a substituted or unsubstituted heteroaryl group, or L;
L represents a —C(=O)—$OR^7$ group, —$SO_2$—$R^3$ group, or —$SO_2NR^8R^9$ group, wherein $R^7$ represents a substituted or unsubstituted alkyl group that has a secondary or tertiary connecting carbon that connects to the remainder of the —C(=O)$OR^7$ group; and $R^3$, $R^8$, and R[9] independently represent substituted or unsubstituted alkyl groups, substituted or unsubstituted aryl groups, or substituted or unsubstituted heteroaryl groups; and Za represents one or more counter ions to balance the electric charge in the rest of the color-changing compound according to Structure (I), wherein the infrared radiation-sensitive image-recording layer comprises one or more borate anions in an amount such that the molar ratio of the one or more borate anions to the one or more iodonium cations is at least 0.5:1, and the borate anions are represented by following Structure (IIIa):

$$B(R^{10}R^{11}R^{12}R^{13})^-$$  Structure (IIIa)

wherein $R^{10}$, $R^{11}$, $R^{12}$, and $R^{13}$ are independently substituted or unsubstituted alkyl groups or substituted or unsubstituted aryl groups, provided that at least three of $R^{10}$, $R^{11}$, $R^{12}$, and $R^{13}$ are the same or different substituted or unsubstituted aryl groups, and the substituted aryl groups each have no more than two halo substituents.

2. The lithographic printing plate precursor of embodiment 1, wherein the molar ratio of the one or more borate anions to the one or more iodonium cations is at least 0.8:1 and up to and including 4:1.

3. The lithographic printing plate precursor of embodiment 1 or 2, wherein the (3) color-changing compound is represented by the following Structure (II):

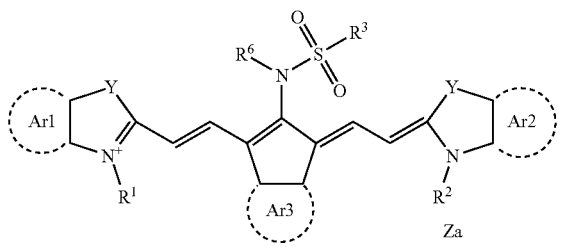

Structure (II)

wherein Ar1, Ar2, Ar3, $R^1$, $R^2$, $R^3$, $R^6$, Y, and Za are as defined above.

4. The lithographic printing plate precursor of any of embodiments 1 to 3, wherein Ar1 and Ar2 are the atoms necessary to complete the same or different substituted or unsubstituted aromatic rings.

5. The lithographic printing plate precursor of any of embodiments 1 to 4, wherein one or both of the aromatic rings completed by the atoms of Ar1 and Ar2 are substituted with one or two halo groups that can be the same or different.

6. The lithographic printing plate precursor of any of embodiments 1 to 5, wherein $R^3$ is a trifluoromethyl group.

7. The lithographic printing plate precursor of any of embodiments 1 to 6, wherein Ar3 represents the carbon and hydrogen atoms needed to complete a benzene ring.

8. The lithographic printing plate precursor of any of embodiments 1 to 7, wherein Za comprises a tetraaryl borate anion.

9 The lithographic printing plate precursor of any of embodiments 1 to 8, wherein the electron-donating agent is an organic borate salt represented by the following Structure (III):

$$[B(R^{10}R^{11}R^{12}R^{13})^-]_n M^{n+}$$  Structure (III)

wherein $R^{10}$, $R^{11}$, $R^{12}$, and $R^{13}$ are as defined for Structure (IIIa), n is an integer equal to or greater than 1, and $M^{n+}$ is an n-valent cation.

10. The lithographic printing plate precursor of embodiment 9, wherein all of $R^{10}$, $R^{11}$, $R^{12}$, and $R^{13}$ in Structure (IIIa) and Structure (III) are the same or different substituted or unsubstituted aryl groups.

11. The lithographic printing plate precursor of embodiment 9, wherein all of $R^{10}$, $R^{11}$, $R^{12}$, and $R^{13}$ in Structure (IIIa) and Structure (III) are the same substituted or unsubstituted phenyl groups.

12. The lithographic printing plate precursor of any of embodiments 1 to 11, wherein one or both of $R^1$ and $R^2$ independently comprises a chain of carbon atoms interrupted by one or more ether or ester linkages.

13. The lithographic printing plate precursor of any of embodiments 1 to 12, wherein the infrared radiation-sensitive image-recording layer further comprises a component (4) infrared absorbing material that is different from the component (3) color-changing compound.

14. The lithographic printing plate precursor of any of embodiments 1 to 13, wherein the component (1) free radical initiator composition comprises a diaryliodonium tetraphenylborate salt.

15. The lithographic printing plate precursor of any of embodiments 1 to 14, wherein the infrared radiation-sensitive image-recording layer further comprises a component (5) acid-sensitive dye precursor that is different from all of the components (1), (2), (3), and (4) defined above.

16. The lithographic printing plate precursor of any of embodiments 1 to 15, wherein the infrared radiation-sensitive image-recording layer further comprises a component (6) non-free radically polymerizable polymeric material that is different from all of the components (1), (2), (3), and (4) defined above.

17. The lithographic printing plate precursor of embodiment 16, wherein the component (6) non-free radically polymerizable polymeric material is present in particulate form.

18. The lithographic printing plate precursor of any of embodiments 1 to 17, wherein, after infrared radiation exposure, the infrared radiation sensitive image-recording layer is developable on-press using a lithographic ink, a fountain solution, or a combination of a lithographic ink and a fountain solution.

19. The lithographic printing plate precursor of any of embodiments 1 to 18, wherein the component (3) color-changing compound represented by Structure (I) is present in the infrared radiation-sensitive image-recording layer in a coverage amount of at least 0.5 weight % and up to and including 15 weight %, based on the total dry coverage of the infrared radiation-sensitive image-recording layer.

20. The lithographic printing plate precursor of any of embodiments 1 to 19, wherein the infrared radiation-sensitive image-recording layer is the outermost layer.

21. The lithographic printing plate precursor of any of embodiments 1 to 20, wherein the component (2) free radically polymerizable composition comprises at least two free radically polymerizable components.

22. The lithographic printing plate precursor of any of embodiments 1 to 21, wherein the substrate comprises an aluminum-containing substrate comprising at least one aluminum oxide layer, and a hydrophilic polymer coating that is disposed on the at least one aluminum oxide layer.

23. The lithographic printing plate precursor of any of embodiments 1 to 22, wherein the substrate comprises an aluminum-containing substrate comprising at least an inner aluminum oxide layer, an outer aluminum oxide layer disposed on the inner aluminum oxide layer, and a hydrophilic polymer coating that is disposed on the outer aluminum oxide layer.

24. A method for providing a lithographic printing plate, comprising:
A) imagewise exposing the lithographic printing plate precursor according to any of embodiments 1 to 23 to infrared radiation, to provide exposed regions and non-exposed regions in the infrared radiation-sensitive image-recording layer, and
B) removing the non-exposed regions in the infrared radiation-sensitive image-recording layer from the substrate.

25. The method of embodiment 24, comprising removing the non-exposed regions in the infrared radiation-sensitive image-recording layer from the substrate on-press using a lithographic printing ink, a fountain solution, or a combination of a lithographic printing ink and a fountain solution.

26. The method of embodiment 24 or 25, wherein imagewise exposing is carried out using at least one infrared radiation-emitting laser.

The following examples are provided to further illustrate the practice of the present invention and are not meant to be limiting in any manner. Unless otherwise indicated, the materials used in the examples were obtained from various commercial sources as indicated but other commercial sources may be available.

An aluminum-containing substrate was prepared for the lithographic printing plate precursors in the following manner:

Hydro 1052 aluminum alloy strip or web (available from Norsk Hydro ASA, Norway) having a thickness of 0.28 mm was used as the aluminum-containing "plate" stock or support. Both pre-etch and post-etch steps were carried out in alkaline solutions under known conditions. Roughening (or graining) of the etched aluminum support was carried out by electrochemical means in a hydrochloric acid solution at about 23° C. to obtain an arithmetic average roughness (Ra) of 0.5 μm on a surface of the aluminum-containing support. Thereafter, the aluminum-containing supports were subjected to two individual anodizing treatments. The first anodizing process was carried out using phosphoric acid as the electrolyte to form an outer aluminum oxide layer with an average micropore diameter ($D_o$) of 19 nm and an average dry thickness ($T_o$) of 60 nm. The second anodizing process was then carried out using phosphoric acid as the electrolyte to form an inner aluminum oxide layer with an average micropore diameter ($D_i$) of 70 nm and an average dry thickness ($T_i$) of 500 nm. These two anodizing steps were carried out in a continuous process on a typical manufacturing line used to manufacture lithographic printing plate precursors. The aluminum-containing support thus prepared was coated with an aqueous solution of polyacrylic acid to give a dry thickness of 0.03 g/m² for a substrate useful in the present invention.

A negative-working, infrared radiation-sensitive image-recording layer was then formed on the aluminum-containing substrate as described by individually coating infrared radiation-sensitive composition formulations having the components and amounts shown in the following TABLES I, II, and III using a bar coater, to provide a dry coating weight of 0.9 g/m² after drying at 50° C. for 60 seconds for each of the inventive and comparative precursors described below. The raw materials noted in TABLE I are identified in the following TABLE II, and the amounts of various components are shown in TABLE III. These materials can be obtained from one or more commercial sources of chemicals or prepared using known synthetic methods and starting materials.

TABLE I

| Component | Amount (grams) |
| --- | --- |
| Polymer dispersion [containing non-free radically polymerizable polymeric material] | 1.056 |
| Hydroxypropyl methyl cellulose | 0.60 |
| Monomer 1 (free radical polymerizable component) | 0.501 |
| Monomer 2 (free radical polymerizable component) | 0.249 |
| Infrared radiation absorber (See Table III) | 0.03 |
| Acid-sensitive dye precursor (See Table III) | 0.035 |
| Color-changing compound (See Table III) | 0.035 |
| Surfactant 1 | 0.069 |
| Initiator composition (See Table III) | 0.09 |
| Compound P1 (only in Inventive Example 10) | 0.008 |
| 1-Propanol | 4.94 |
| 2-Butanone | 2.40 |
| 1-Methoxy-2-propanol | 4.22 |
| δ-Butyrolactone | 0.14 |
| Water | 0.66 |

TABLE II

| | |
| --- | --- |
| Polymer dispersion | The polymer dispersion was prepared according to Example 10 of EP 1,765,593, used as 23.5 weight % polymer in n-propanol/water at 80:20 weight ratio |
| Hydroxypropyl methyl cellulose | 5 weight % hydroxypropyl methyl cellulose polymer in water; the polymer is 30% methoxylated, 10% hydroxyl propoxylated and had a viscosity of 5 mPa-sec in a 2 weight % aqueous solution at 20° C. |
| Monomer 1 | Urethane acrylate prepared by reacting DESMODUR ® N100 (from Bayer Corp., Milford, CT) with hydroxyethyl acrylate and pentaerythritol triacrylate at approximately 1:1.5:1.5 molar ratio (40 weight % in 2-butanone). |

TABLE II-continued
| | |
|---|---|
| Monomer 2 | Ethoxylated (10 EO) Bisphenol A diacrylate, 40 weight % in 2-butanone |
| IR dye 1 | 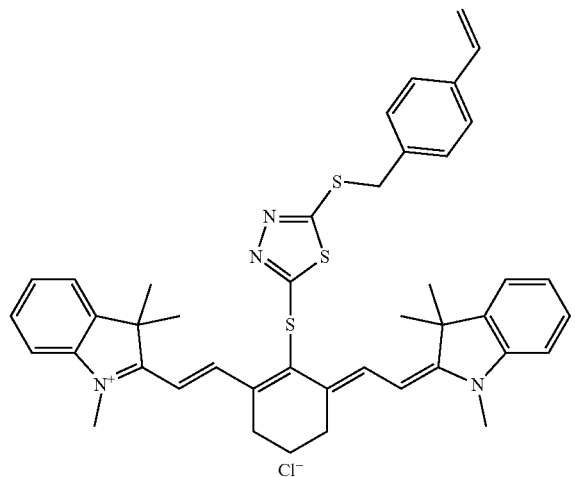 |
| ASDP1 | 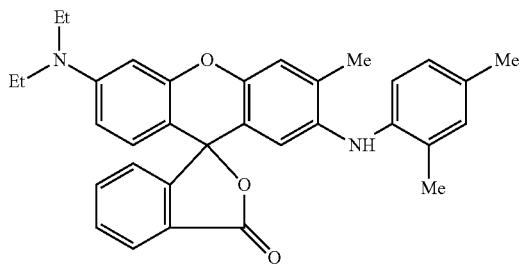 [SMILES: CCN(CC)c1ccc2c(c1)Oc1cc(C)c(Nc3ccc(C)cc3C)cc1C21OC(=O)c2ccccc21] |
| ASDP2 | 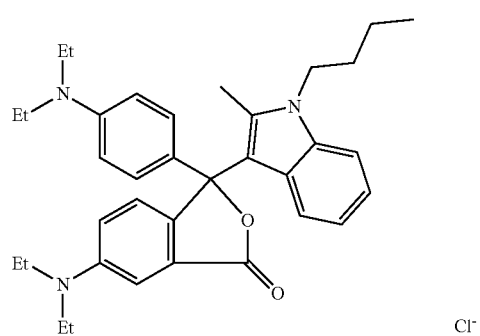 [SMILES: CCCCn1c(C)c(C2(c3ccc(N(CC)CC)cc3)OC(=O)c3cc(N(CC)CC)ccc32)c2ccccc21 ; [Cl-]] |
| Surfactant 1 | BYK ® 302 from Byk Chemie, used as a 25 weight % solution in 1-methoxy-2-propanol |
| IC1 | 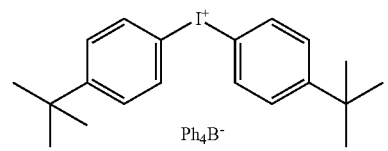 Ph₄B⁻ |
| IC2 | 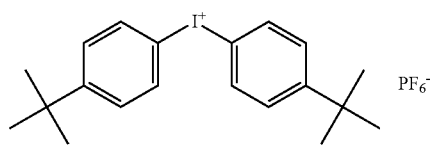 PF₆⁻ |
| IC3 | Ph₄B⁻ Na⁺ |
| IC4 | 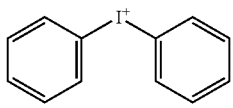 [SMILES: c1ccc([I+]c2ccccc2)cc1] |

TABLE II-continued
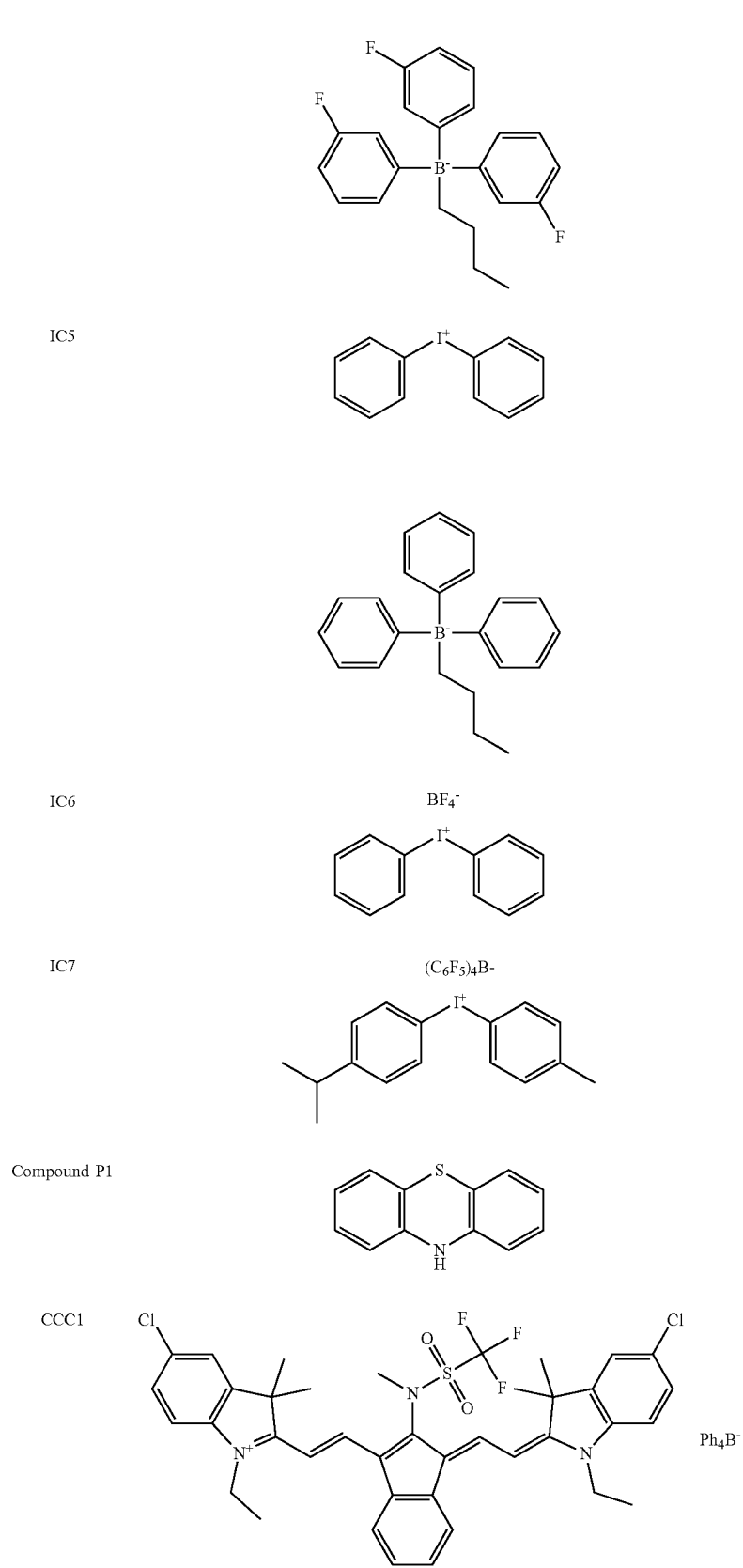

TABLE II-continued

CCC2
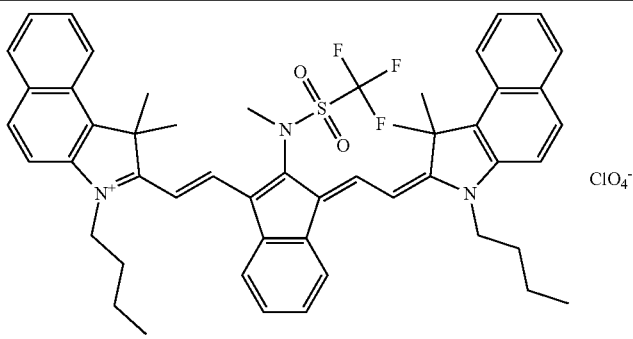
ClO₄⁻

CCC3
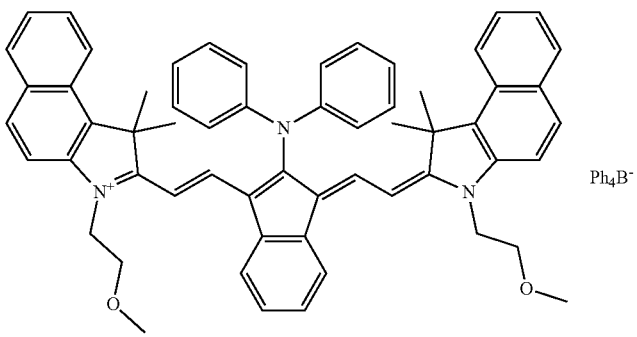
Ph₄B⁻

CCC4
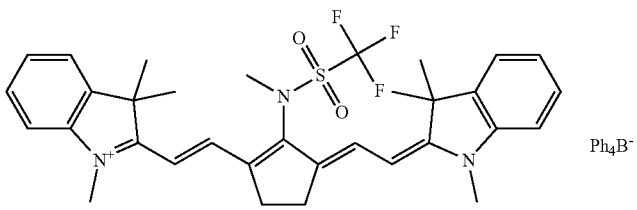
Ph₄B⁻

CCC5
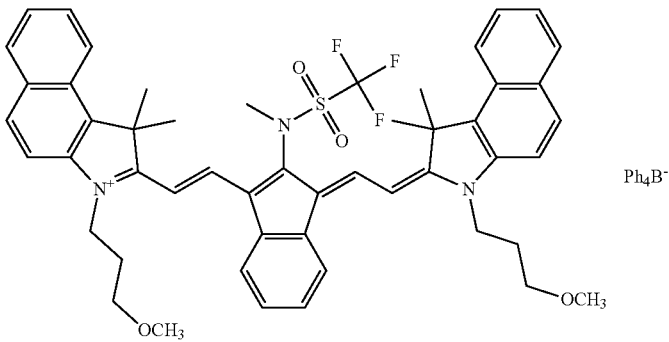
Ph₄B⁻

| Example | Initiator Composition | B⁻/I⁺ [mol/mol]** | Infrared Absorber | Acid-sensitive dye precursor | Color-changing compound |
|---|---|---|---|---|---|
| Comparative 1 | IC1 | 1.0 | IR Dye 1 | ASDP1 | None |
| Inventive 1 | IC1 | 1.3 | IR Dye 1 | None | CCC1 |
| Inventive 2 | IC1 | 1.0 | IR Dye 1 | None | CCC2 |
| Inventive 3 | IC1 | 1.3 | None | None | CCC1 |
| Inventive 4 | IC1 | 1.3 | IR Dye 1 | ASDP2 | CCC1 |
| Comparative 2 | IC2 | 0 | IR Dye 1 | None | CCC2 |
| Comparative 3 | IC3 | n.a. | IR Dye 1 | None | CCC1 |
| Comparative 4 | IC1 | 1.2 | IR Dye 1 | None | CCC3 |
| Comparative 5 | IC1 | 1.3 | IR Dye 1 | None | CCC4 |
| Inventive 5 | IC4 | 1.2 | IR Dye 1 | None | CCC2 |
| Inventive 6 | IC5 | 1.6 | IR Dye 1 | None | CCC2 |
| Comparative 6 | IC6 | 0 | IR Dye 1 | None | CCC2 |
| Comparative 7 | IC7 | 0 | IR Dye 1 | None | CCC2 |
| Comparative 8 | IC1 | 1.0 | IR Dye 1 | ASDP2 | none |
| Inventive 7 | IC1 | 1.0 | IR Dye 1 | ASDP2 | CCC2 |
| Inventive 8* | IC1 | 1.0 | IR Dye 1 | ASDP2 | CCC2 |
| Inventive 9 | IC1 | 1.2 | IR Dye 1 | none | CCC5 |
| Inventive 10 | IC1/IC2 (0.075/0.015) | 1.0 | IR Dye 1 | none | CCC5 |

TABLE III-continued

| Example | Initiator Composition | B⁻/I⁺ [mol/ mol]** | Infrared Absorber | Acid-sensitive dye precursor | Color-changing compound |
|---|---|---|---|---|---|
| Inventive 11 | IC1/IC2 (0.053/0.038) | 0.7 | IR Dye 1 | none | CCC5 |
| Comparative 9 | IC1/IC2 (0.023/0.068) | 0.4 | IR Dye 1 | none | CCC5 |
| Inventive 12 | IC1/IC3 (0.060/0.030) | 2.4 | IR Dye 1 | none | CCC5 |
| Comparative 10 | IC1/IC3 (0.038/0.053) | 4.5 | IR Dye 1 | none | CCC5 |

*Inventive Example 8 contains Compound P1 as indicated in Table I above.
** B⁻/I⁺ [mol/mol] represents the molar ratio of one or more borate anions to one or more iodonium cations, and the one or more borate anions represented by Structure (IIIa) above.

Each of the inventive and comparative lithographic printing plate precursors was evaluated using four tests: "on-press developability" (DOP), "imaging speed", "print-out image" (PO), and "dark fading". The results are summarized below in TABLE IV.

On-Press Developability:

On-press developability was evaluated by imagewise exposing each lithographic printing plate precursor at 15-150 mJ/cm² using a Trendsetter 3244x. Each imagewise exposed lithographic printing plate precursor was then mounted onto a MAN Roland Favorite 04 press machine without developing (processing). Fountain solution (Varn Supreme 6038) and lithographic printing ink (Gans Cyan) were supplied, and lithographic printing was performed. On-press development occurred during printing and was evaluated by counting the number of printed paper sheets needed to receive a clean background and was given one of the following qualitative values based on the number of printed paper sheets to achieve a clean background. The + and 0 evaluations are acceptable for this test parameter.

| + | <15 printing paper sheets |
| 0 | 15-35 printed paper sheets |
| − | >35 printed paper sheets |

Imaging Speed:

Each of the lithographic printing plate precursors was exposed and developed as described above. Imaging speed was measured on paper after 1000 impressions by a determination of ink density for solids exposed to different energies. The inflection point of ink density vs. exposure energy is regarded as a measure for imaging speed. The following qualitative values were given as the results of the individual experiments, with lower imaging energy desirable. The + and 0 evaluations are acceptable for this parameter.

| + | imaging speed < 30 mJ/cm² |
| 0 | imaging speed = 30-60 mJ/cm² |
| − | imaging speed > 60 mJ/cm² |

Printout Image:

Each of the lithographic printing plate precursors was imagewise exposed using a Trendsetter 800 III Quantum TH 1.7 (available from Eastman Kodak Company) at 90 mJ/cm² to provide exposed regions and non-exposed regions in the negative-working, IR-sensitive image-recording layer. For each imagewise exposed lithographic printing plate precursor, the color difference between exposed regions and non-exposed regions was measured, within 10 min from the completion of the imagewise exposing, by determining the $\Delta E$ value, using a Techkon Spectro Dens spectral densitometer, calculating the Euclidean distance of the measured $L^*a^*b^*$ values, and given the following qualitative values immediately after exposure.

| +++ | $20 \leq \Delta E$ |
| ++ | $11 \leq E < 20$ |
| + | $8 \leq \Delta E < 11$ |
| 0 | $5 \leq \Delta E < 8$ |
| − | $\Delta E < 5$ |

Dark Fading:

Each lithographic printing plate was imagewise exposed as described above, and then stored in the dark for 24 hours. The $\Delta E$ measurements were then taken as described above, and given the following qualitative values.

| +++ | $20 \leq \Delta E$ |
| ++ | $11 \leq \Delta E < 20$ |
| + | $8 \leq \Delta E < 11$ |
| 0 | $5 \leq \Delta E < 8$ |
| − | $\Delta E < 5$ |

TABLE IV

| Example | DOP | Imaging Speed | Printout Image | Dark Fading |
|---|---|---|---|---|
| Comparative 1 | 0 | 0 | 0 | − |
| Inventive 1 | 0 | 0 | ++ | ++ |
| Inventive 2 | 0 | 0 | ++ | ++ |
| Inventive 3 | 0 | 0 | + | + |
| Inventive 4 | 0 | 0 | +++ | ++ |
| Comparative 2 | 0 | − | − | − |
| Comparative 3 | 0 | − | ++ | ++ |
| Comparative 4 | 0 | 0 | 0 | − |
| Comparative 5 | 0 | 0 | 0 | 0 |
| Inventive 5 | 0 | 0 | ++ | ++ |
| Inventive 6 | − | 0 | ++ | ++ |
| Comparative 6 | 0 | − | − | − |
| Comparative 7 | 0 | − | − | − |
| Comparative 8 | 0 | 0 | ++ | − |
| Inventive 7 | 0 | 0 | +++ | ++ |
| Inventive 8 | 0 | 0 | +++ | ++ |
| Inventive 9 | 0 | 0 | ++ | ++ |
| Inventive 10 | 0 | 0 | ++ | ++ |
| Inventive 11 | 0 | 0 | + | + |
| Comparative 9 | 0 | 0 | 0 | 0 |
| Inventive 12 | 0 | 0 | ++ | ++ |
| Comparative 10 | 0 | − | ++ | ++ |

The results shown in TABLE IV support a number of conclusions. The data for Comparative Example 1 indicate that traditional acid-sensitive lactone-base leuco dyes such as Acid-Sensitive Dye Precursor 1 typically provides a medium or acceptable printout immediately after exposure without any long term storage, but the printout becomes poorer after storage of the image (for example, considering the dark fading results). In Comparative Example 8 where a highly acid-sensitive lactone-based dye precursor ASDP2 was used, a strong printout immediately after exposure without any long term storage was obtained, but the printout became poor after storage of the image.

The results for Comparative Example 4, compared to those for Inventive Example 2, indicate that the presence of the N-triflamido (or trifluoromethylsulfonamido) group in the (3) color-changing compound of Structure (I) provides an improvement in printout and dark fading. A compound such as Comparative color-changing compound 2 having an indene ring connected to a diphenylamino group instead of an N-triflamido group typically provides a medium or acceptable printout image immediately after imaging but this printout image becomes poorer after dark fading storage. The difference between Comparative Example 4 and Inventive Example 2 demonstrates that in addition to Ar3 group in Structure (I), the specified —X-L group is also important for the efficiency of phenylation reaction to form a stable colored species as explained above. The poor printout image and dark fading of the precursor in Comparative Example 4 relative to these values of the precursor in Inventive Example 9 further supports the importance of the inventive —X-L group. The color-changing compound CCC3 in Comparative Example 4 and the color-changing compound CCC5 in Inventive Example 9 have identical structures except for the different-X-L groups. ICCC3 has a diphenylamino group as an —X-L group and thus falls outside the scope of the Structure (I) as described above.

The results for Comparative Example 2, compared to those for Inventive Example 2, indicate that the presence of a tetraphenylborate anion is desirable in order to have a strong printout image immediately after imaging as well as after dark storage. As explained above, tetraphenylborate anion can react with the inventive color-changing compound 2 to form a colored phenylation product. Typical initiator compositions such as that used in Comparative Example 2 are not effective for inducing the chemical changes to each inventive (3) color-changing compound under the given exposure energy level of 90 mJ/cm$^2$. In other words, at this exposure energy level, the inventive color-changing compound 2 does not have sufficient chemical conversion of the triflamido group [—X-L group in Structure (I)] for color forming purpose under heat or the presence of acid produced by the iodonium salt of initiator composition 2. Additionally, the unacceptable imaging speed used for Comparative Example 2 indicates that the tetraphenylborate anion is also needed for optimal imaging speed.

Results of Comparative Example 9, and Inventive Examples 9, 10, 11 and 12 also demonstrate that lowering the molar ratio of borate anions to iodonium cations results in the decrease of printout generation. On the other hand, increasing the borate concentration up to a molar ratio of borate anions to iodonium cations of bigger than 4, as demonstrated in Comparative Example 10, results in strong printout generation but loss of photospeed.

Additionally, the results for Comparative Example 3 indicate that the color formation reaction of the (3) color-changing compound can be induced by the presence of tetraphenylborate anion as an electron-donating agent, even without the presence of an iodonium cation in the (1) free radical initiator composition. Of course, the presence of an iodonium cation is still essential for adequate imaging speed, or other known ingredients for enhancing free radical generation need to be added into the free radical initiator composition.

Relative to Inventive Example 1, the results of Comparative Example 5 showed lower printout both immediately after imaging and after dark storage. These differences demonstrate that the presence of the (3) color-changing compound "Inventive dye 1" having an indene ring (benzene as AR3 in Structure I) in the conjugate chain according to Structures (I) and (II) provides an improvement in printout image compared to the comparative color-changing compound 3 that has a cyclopentene ring in the conjugate chain. The difference between Comparative Example 5 and Inventive Example 1 demonstrates that Ar3 in Structures (I) and (II) affects the geometry of the polymethine chain of the color-changing compound and makes it to react more readily with the tetraphenyl borate anion to form stable colored phenylation product as explained above. In addition to the ΔE differences, it is also noted that the exposed region of Inventive Example 1 has a reddish hue, likely attributable to the phenylation product having an absorption peak around 514 nm in the visible spectrum. The lithographic printing plate precursors in other inventive examples also have a reddish hue in the infrared radiation exposed regions. On the other hand, Comparative Example 5 has a bluish hue, which is believed to be caused by a low conversion of the N-methyl triflamido group in the Comparative color-changing compound 2 into an N-methylamino group.

Comparative Examples 6 and 7 show that the borate anions provided by IC6 and IC7 are not effective for good printout images to be formed from the color changing compound CCC2. These borate anions are outside the scope of Structure (IIIa) above and thus are not included in the calculation of the B$^-$/I$^+$ molar ratio.

Relative to the results for Inventive Example 1, Inventive Example 3 showed lower printout both immediately after imaging and after dark storage. It is believed that these differences may be caused by less than desired IR absorption by (3) color-changing compound 1 under the specific imaging conditions and energy. However, it is also believed that the combined use of the various (3) color-changing compounds according to the present invention with other infrared absorbing dyes can produce improved results.

Relative to the results for Inventive Example 1, the results for Inventive Example 4 showed even higher printout image immediately after imaging. This result indicates that the advantages of using the inventive (3) color-changing compounds can be further enhanced through their combined use with traditional (5) acid-sensitive dye precursors. On the other hand, the improvement from the added acid sensitive dye precursor is still transient, as the contribution to ΔE printout by the acid sensitive dye precursor 2 is known to fade over time. After 24 hour dark fading, Inventive Examples 1 and 4 showed comparable ΔE printout values, which are largely contributed to by the inventive (3) color-changing compound 1.

Relative to the results for Inventive Example 1, the results for Inventive Example 2 showed somewhat lower printout image immediately after imaging and after dark fading. The differences are believed to be caused by lower concentration of tetraphenylborate anion in Inventive Example 2 and presence of non-electron-donating anions in inventive (3) color-changing compound 2, both of which reduce the efficiency of phenylation reaction of the inventive color-forming compound 2 relative to the inventive color-changing compound 1.

The invention has been described in detail with particular reference to certain preferred embodiments thereof, but it will be understood that variations and modifications can be effected within the spirit and scope of the invention.

The invention claimed is:

1. A lithographic printing plate precursor comprising:
   a substrate, and
   an infrared radiation-sensitive image-recording layer disposed on the substrate, the infrared radiation-sensitive image-recording layer comprising the following components (1), (2), and (3):
   (1) a free radical initiator composition that is capable of generating free radicals upon exposure to infrared radiation, and which comprises an electron-donating agent and one or more iodonium cations;

(2) a free radically polymerizable composition; and (3) a color-changing compound that is represented by the following Structure (I)

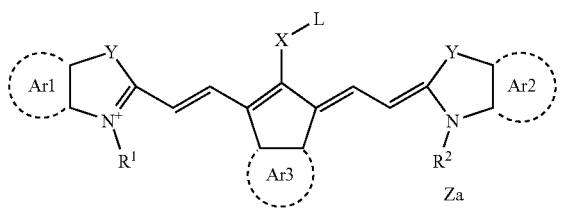

Structure (I)

wherein:

Ar1, Ar2, and Ar3 independently represent the atoms necessary to complete substituted or unsubstituted aromatic rings or to complete substituted or unsubstituted heteroaromatic rings;

Y represents an oxygen atom, a sulfur atom, or a dialkylmethylene group represented by $>C(R^4R^5)$ wherein $R^4$ and $R^5$ are independently substituted or unsubstituted alkyl groups having 1 to 4 carbons;

$R^1$ and $R^2$ are independently substituted or unsubstituted alkyl groups;

X represents a single bond or a divalent linking group selected from —S—, —O—, and $>N(R^6)$ wherein $R^6$ is hydrogen, a substituted or unsubstituted alkyl group, a substituted or unsubstituted aryl group, a substituted or unsubstituted heteroaryl group, or L;

L represents a —C(=O)—OR$^7$ group, —SO$_2$—R$^3$ group, or —SO$_2$NR$^8$R$^9$ group, wherein $R^7$ represents a substituted or unsubstituted alkyl group that has a secondary or tertiary connecting carbon that connects to the remainder of the —C(=O)OR$^7$ group; and $R^3$, $R^8$, and $R^9$ independently represent substituted or unsubstituted alkyl groups, substituted or unsubstituted aryl groups, or substituted or unsubstituted heteroaryl groups; and Za represents one or more counter ions to balance the electric charge in the rest of the color-changing compound according to Structure (I), wherein the infrared radiation-sensitive image-recording layer comprises one or more borate anions in an amount such that the molar ratio of the one or more borate anions to the one or more iodonium cations is at least 0.8:1 and up to and including 4:1, and the borate anions are represented by following Structure (IIIa):

Structure (IIIa)

wherein $R^{10}$, $R^{11}$, $R^{12}$, and $R^{13}$ are independently substituted or unsubstituted alkyl groups or substituted or unsubstituted aryl groups, provided that at least three of $R^{10}$, $R^{11}$, $R^{12}$, and $R^{13}$ are the same or different substituted or unsubstituted aryl groups, and the substituted aryl groups each have no more than two halo substituents.

2. The lithographic printing plate precursor of claim 1, wherein the (3) color-changing compound is represented by the following Structure (II):

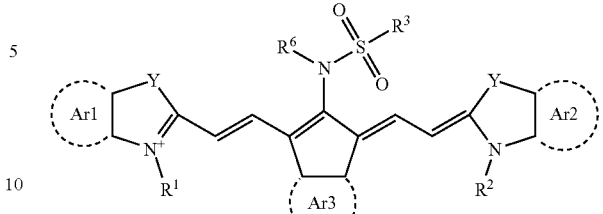

Structure (II)

wherein Ar1, Ar2, Ar3, $R^1$, $R^2$, $R^3$, $R^6$, Y, and Za are as defined above.

3. The lithographic printing plate precursor of claim 1, wherein Ar1 and Ar2 are the atoms necessary to complete the same or different substituted or unsubstituted aromatic rings.

4. The lithographic printing plate precursor of claim 1, wherein one or both of the aromatic rings completed by the atoms of Ar1 and Ar2 are substituted with one or two halo groups that can be the same or different.

5. The lithographic printing plate precursor of claim 1, wherein $R^3$ is a trifluoromethyl group.

6. The lithographic printing plate precursor of claim 1, wherein Za comprises a tetraaryl borate anion.

7. The lithographic printing plate precursor of claim 1, wherein the electron-donating agent is an organic borate salt represented by the following Structure (III):

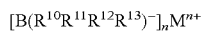

Structure (III)

wherein $R^{10}$, $R^{11}$, $R^{12}$, and $R^{13}$ are as defined for Structure (IIIa), n is an integer equal to or greater than 1, and $M^{n+}$ is an n-valent cation.

8. The lithographic printing plate precursor of claim 7, wherein all of $R^{10}$, $R^{11}$, $R^{12}$, and $R^{13}$ in Structure (IIIa) and Structure (III) are the same substituted or unsubstituted phenyl groups.

9. The lithographic printing plate precursor of claim 1, wherein the infrared radiation-sensitive image-recording layer further comprises a component (4) infrared absorbing material that is different from the component (3) color-changing compound.

10. The lithographic printing plate precursor of claim 1, wherein the component (1) free radical initiator composition comprises a diaryliodonium tetraphenylborate salt.

11. The lithographic printing plate precursor of claim 9, wherein the infrared radiation-sensitive image-recording layer further comprises a component (5) acid-sensitive dye precursor that is different from all of the components (1), (2), (3), and (4) defined above.

12. The lithographic printing plate precursor of claim 9, wherein the infrared radiation-sensitive image-recording layer further comprises a component (6) non-free radically polymerizable polymeric material that is different from all of the components (1), (2), (3), and (4) defined above and is present in particulate form.

13. The lithographic printing plate precursor of claim 1, wherein the component (3) color-changing compound represented by Structure (I) is present in the infrared radiation-sensitive image-recording layer in a coverage amount of at least 0.5 weight % and up to and including 15 weight %, based on the total weight of the infrared radiation-sensitive image-recording layer.

14. A method for providing a lithographic printing plate, comprising:
   A) imagewise exposing the lithographic printing plate precursor according to claim 1 to infrared radiation, to provide exposed regions and non-exposed regions in the infrared radiation-sensitive image-recording layer, and
   B) removing the non-exposed regions in the infrared radiation-sensitive image-recording layer from the substrate on-press using a lithographic printing ink, a fountain solution, or a combination of a lithographic printing ink and a fountain solution.

15. The lithographic printing plate precursor of claim 1, wherein the molar ratio of the one or more borate anions to the one or more iodonium cations is at least 0.8:1 and up to and including 2.5:1.

16. The lithographic printing plate precursor of claim 1, wherein the component (3) color-changing compound according to Structure (I), absent the counterion Za, is positively charged.

17. The lithographic printing plate precursor of claim 1, wherein the infrared radiation-sensitive image-recording layer is capable of producing a color change when exposed to infrared radiation for 90 mJ/cm² and stored in the dark for 24 hours, and this color change in ΔE units is at least 3 or more than the color change in ΔE units of a reference infrared radiation-sensitive image-recording layer that is identical to the infrared radiation-sensitive image-recording layer except for substitution of hexafluorophosphate anion for all borate anions represented by Structure (IIIa).

18. The lithographic printing plate precursor of claim 1, wherein the infrared radiation-sensitive image-recording layer is capable of producing a colored compound when exposed to infrared radiation, and the produced colored compound satisfies the following equation A:

$$FW3 > FW1 \quad \text{(Equation A)}$$

wherein FW1 is the formula weight in Daltons of the (3) color-changing compound according to Structure (I), absent the counter ion Za, and FW3 is the formula weight in Daltons of the produced colored compound, absent the counter ion Za.

19. The lithographic printing plate precursor of claim 1, wherein the infrared radiation-sensitive image-recording layer is capable of producing a colored compound when exposed to infrared radiation and the produced colored compound satisfies at least one of the following equations B, C, D, and E:

$$FW1+FW21+2 \geq FW3 \geq FW1+FW21-2 \quad \text{(Equation B)}$$

$$FW1+FW22+2 \geq FW3 \geq FW1+FW22-2 \quad \text{(Equation C)}$$

$$FW1+FW23+2 \geq FW3 \geq FW1+FW23-2 \quad \text{(Equation D)}$$

$$FW1+FW24+2 \geq FW3 \geq FW1+FW24-2 \quad \text{(Equation E)}$$

wherein:
FW1 is the formula weight in Daltons of the (3) color-changing compound according to Structure (I), absent the counter ion Za,
FW21 is the formula weight in Daltons of $R^{10}$ in Structure (IIIa),
FW22 is the formula weight in Daltons of $R^{11}$ in Structure (IIIa),
FW23 is the formula weight in Daltons of $R^{12}$ in Structure (IIIa),
FW24 is the formula weight in Daltons of $R^{13}$ in Structure (IIIa), and
FW3 is the formula weight in Daltons of the produced colored compound, absent the counter ion Za.

20. The method of claim 14, wherein when the imagewise exposing in A) is carried out with infrared radiation at 90 mJ/cm², the imagewise exposing causes the infrared radiation-sensitive image-recording layer of the lithographic printing plate precursor to produce a color change which when stored in the dark for 24 hours, ΔE units is at least 3 or more than the color change in ΔE units of a reference infrared radiation-sensitive image-recording layer that is imagewise exposed in the same manner and is identical to the infrared radiation-sensitive image-recording layer except for substitution of hexafluorophosphate anion for all borate anions represented by Structure (IIIa).

21. The method of claim 14, wherein the imagewise exposing in A) to infrared radiation causes the infrared radiation-sensitive image-recording layer of the lithographic printing plate precursor the infrared radiation-sensitive image-recording layer to produce a colored compound that satisfies the following equation A:

$$FW3 > FW1 \quad \text{(Equation A)}$$

wherein FW1 is the formula weight in Daltons of the (3) color-changing compound according to Structure (1), absent the counter ion Za, and FW3 is the formula weight in Daltons of the produced colored compound, absent the counter ion Za.

22. The method of claim 14, wherein the imagewise exposing in A) to infrared radiation causes the infrared radiation-sensitive image-recording layer of the lithographic printing plate precursor to produce a colored compound that satisfies at least one of the following equations B, C, D, and E:

$$FW1+FW21+2 \geq FW3 \geq FW1+FW21-2 \quad \text{(Equation B)}$$

$$FW1+FW22+2 \geq FW3 \geq FW1+FW22-2 \quad \text{(Equation C)}$$

$$FW1+FW23+2 \geq FW3 \geq FW1+FW23-2 \quad \text{(Equation D)}$$

$$FW1+FW24+2 \geq FW3 \geq FW1+FW24-2 \quad \text{(Equation E)}$$

wherein:
FW1 is the formula weight in Daltons of the (3) color-changing compound according to Structure (I), absent the counter ion Za,
FW21 is the formula weight in Daltons of $R^{10}$ in Structure (IIIa),
FW22 is the formula weight in Daltons of $R^{11}$ in Structure (IIIa),
FW23 is the formula weight in Daltons of $R^{12}$ in Structure (IIIa),
FW24 is the formula weight in Daltons of $R^{13}$ in Structure (IIIa), and
FW3 is the formula weight in Daltons of the produced colored compound, absent the counter ion Za.

* * * * *